United States Patent [19]

Gotou et al.

[11] Patent Number: 5,062,111
[45] Date of Patent: Oct. 29, 1991

[54] ERROR CHECK CODE GENERATING DEVICE AND TRANSMISSION ERROR DETECTING DEVICE

[75] Inventors: Kouji Gotou; Hiroshi Kuranaga; Takeo Nakabayashi, all of Hyogo, Japan

[73] Assignee: Mitsubishi Denki Kabushiki Kaisha, Tokyo, Japan

[21] Appl. No.: 426,958

[22] Filed: Oct. 26, 1989

[30] Foreign Application Priority Data

Oct. 28, 1988 [JP] Japan .................................. 63-273843
Aug. 18, 1989 [JP] Japan .................................. 1-213512

[51] Int. Cl.$^5$ ............................................ G06F 11/10
[52] U.S. Cl. .................................................. 371/37.1
[58] Field of Search ............... 371/37.1, 37.7, 38.1, 371/39.1, 49.2, 53, 54

[56] References Cited

U.S. PATENT DOCUMENTS 4,414,667 11/1983 Bennett .............................. 371/37.1
4,677,623 6/1987 Iwasaki ............................. 371/39.1
4,771,429 9/1988 Davis ............................. 371/37.1 X

OTHER PUBLICATIONS

Vincent Alisouskas and Wayne Tomasi "Digital and Data Communication", Prentiss-Hall Inc. (1985), pp. 50-53, 210-211.
Fasclcle, VIII.II.-Rec. vol. 41, pp. 272-273.

Primary Examiner—Robert W. Beausoliel
Attorney, Agent, or Firm—Lowe, Price, LeBlanc and Becker

[57] ABSTRACT

There are disclosed an FCS encoder responsive to data to be transmitted for generating a frame check sequence (FCS) code to check a transmission error, and an FCS decoder for detecting an error. These FCS encoder and FCS decoder have a division circuit and a multiplication circuit each of which comprises shift registers in 16 stages and EXOR gates. Since there is no need for logical elements to be connected between the respective shift registers, this FCS encoder can be constituted to show a regular circuit layout on a semiconductor substrate.

13 Claims, 27 Drawing Sheets

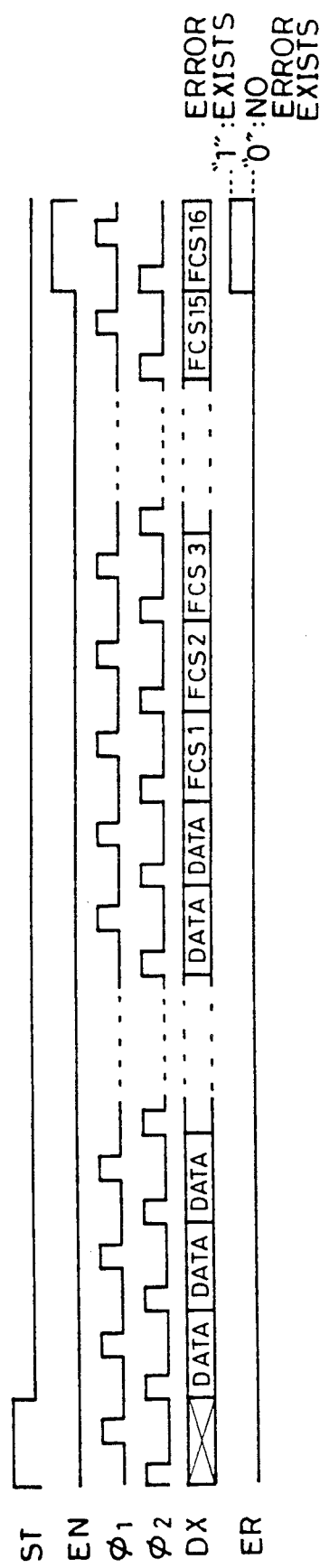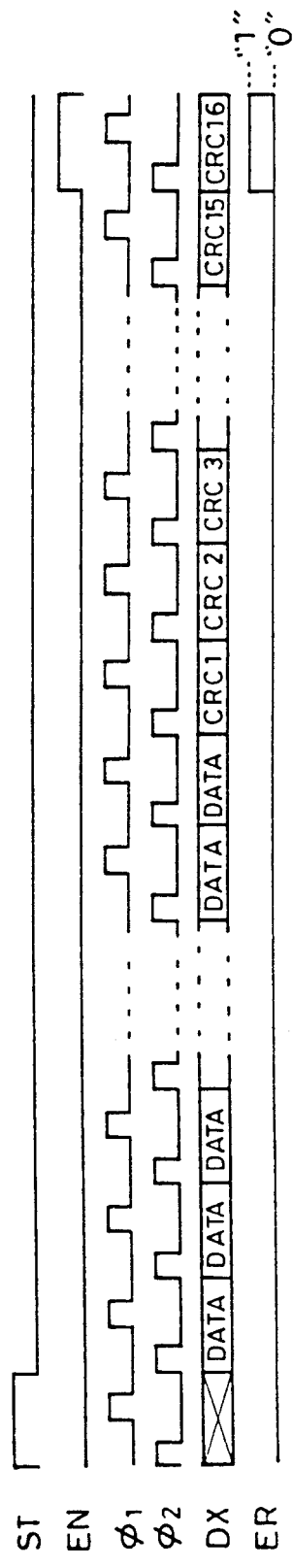

FIG.7B

| | DI | \multicolumn{16}{c|}{NODES} | DO |
| | | 1 | 2 | 3 | 4 | 5 | 6 | 7 | 8 | 9 | 10 | 11 | 12 | 13 | 14 | 15 | 16 | |
|---|---|---|---|---|---|---|---|---|---|---|---|---|---|---|---|---|---|---|
| $t_0$ |   | 0 | 0 | 0 | 0 | 0 | 0 | 0 | 0 | 0 | 0 | 0 | 0 | 0 | 0 | 0 | 0 |   |
| $t_1$ | 1 | 1 | 0 | 0 | 0 | 0 | 0 | 0 | 0 | 0 | 0 | 0 | 0 | 0 | 0 | 0 | 0 | 1 |
| $t_2$ | 0 | 0 | 1 | 0 | 0 | 0 | 0 | 0 | 0 | 0 | 0 | 0 | 0 | 0 | 0 | 0 | 0 | 0 |
| $t_3$ | 1 | 1 | 0 | 1 | 0 | 0 | 0 | 0 | 0 | 0 | 0 | 0 | 0 | 0 | 0 | 0 | 0 | 1 |
| $t_4$ | 0 | 0 | 1 | 0 | 1 | 0 | 0 | 0 | 0 | 0 | 0 | 0 | 0 | 0 | 0 | 0 | 0 | 0 |
| $t_5$ | 0 | 1 | 0 | 1 | 0 | 1 | 0 | 0 | 0 | 0 | 0 | 0 | 0 | 0 | 0 | 0 | 0 | 1 |
| $t_6$ | 1 | 1 | 1 | 0 | 1 | 0 | 1 | 0 | 0 | 0 | 0 | 0 | 0 | 0 | 0 | 0 | 0 | 1 |
| $t_7$ | 0 | 1 | 1 | 1 | 0 | 1 | 0 | 1 | 0 | 0 | 0 | 0 | 0 | 0 | 0 | 0 | 0 | 1 |
| $t_8$ | 0 | 0 | 1 | 1 | 1 | 0 | 1 | 0 | 1 | 0 | 0 | 0 | 0 | 0 | 0 | 0 | 0 | 0 |
| $t_9$ | 0 | 1 | 0 | 1 | 1 | 1 | 0 | 1 | 0 | 1 | 0 | 0 | 0 | 0 | 0 | 0 | 0 | 1 |
| $t_{10}$ | 0 | 1 | 1 | 0 | 1 | 1 | 1 | 0 | 1 | 0 | 1 | 0 | 0 | 0 | 0 | 0 | 0 | 1 |
| $t_{11}$ | 1 | 0 | 1 | 1 | 0 | 1 | 1 | 1 | 0 | 1 | 0 | 1 | 0 | 0 | 0 | 0 | 0 | 0 |
| $t_{12}$ | 1 | 0 | 0 | 1 | 1 | 0 | 1 | 1 | 1 | 0 | 1 | 0 | 1 | 0 | 0 | 0 | 0 | 0 |
| $t_{13}$ | 0 | 1 | 0 | 0 | 1 | 1 | 0 | 1 | 1 | 1 | 0 | 1 | 0 | 1 | 0 | 0 | 0 | 1 |
| $t_{14}$ | 1 | 1 | 1 | 0 | 0 | 1 | 1 | 0 | 1 | 1 | 1 | 0 | 1 | 0 | 1 | 0 | 0 | 1 |
| $t_{15}$ | 0 | 0 | 1 | 1 | 0 | 0 | 1 | 1 | 0 | 1 | 1 | 1 | 0 | 1 | 0 | 1 | 0 | 0 |
| $t_{16}$ | 0 | 1 | 0 | 1 | 1 | 0 | 0 | 1 | 1 | 0 | 1 | 1 | 1 | 0 | 1 | 0 | 1 | 1 |
| $t_{17}$ | 0 | 1 | 1 | 0 | 1 | 1 | 0 | 0 | 1 | 1 | 0 | 1 | 1 | 1 | 0 | 1 | 0 | 1 |
| $t_{18}$ | 1 | 1 | 1 | 1 | 0 | 1 | 1 | 0 | 0 | 1 | 1 | 0 | 1 | 1 | 1 | 0 | 1 | 1 |
| $t_{19}$ | 0 | 1 | 1 | 1 | 1 | 0 | 1 | 1 | 0 | 0 | 1 | 1 | 0 | 1 | 1 | 1 | 0 | 1 |
| $t_{20}$ | 0 | 0 | 1 | 1 | 1 | 1 | 0 | 1 | 1 | 0 | 0 | 1 | 1 | 0 | 1 | 1 | 1 | 0 |
| $t_{21}$ | 1 | 0 | 0 | 1 | 1 | 1 | 1 | 0 | 1 | 1 | 0 | 0 | 1 | 1 | 0 | 1 | 1 | 0 |
| $t_{22}$ | 1 | 1 | 0 | 0 | 1 | 1 | 1 | 1 | 0 | 1 | 1 | 0 | 0 | 1 | 1 | 0 | 1 | 1 |
| $t_{23}$ | 0 | 0 | 1 | 0 | 0 | 1 | 1 | 1 | 1 | 0 | 1 | 1 | 0 | 0 | 1 | 1 | 0 | 0 |
| $t_{24}$ | 1 | 0 | 0 | 1 | 0 | 0 | 1 | 1 | 1 | 1 | 0 | 1 | 1 | 0 | 0 | 1 | 1 | 0 |

FIG.8B

| | DI | \multicolumn{16}{c|}{NODES} | DO |
| | | 1 | 2 | 3 | 4 | 5 | 6 | 7 | 8 | 9 | 10 | 11 | 12 | 13 | 14 | 15 | 16 | |
|---|---|---|---|---|---|---|---|---|---|---|---|---|---|---|---|---|---|---|
| $t_0$ | | 0 | 0 | 0 | 0 | 0 | 0 | 0 | 0 | 0 | 0 | 0 | 0 | 0 | 0 | 0 | 0 | |
| $t_1$ | 1 | 1 | 0 | 0 | 0 | 0 | 0 | 0 | 0 | 0 | 0 | 0 | 0 | 0 | 0 | 0 | 0 | 1 |
| $t_2$ | 0 | 0 | 1 | 0 | 0 | 0 | 0 | 0 | 0 | 0 | 0 | 0 | 0 | 0 | 0 | 0 | 0 | 0 |
| $t_3$ | 1 | 1 | 0 | 1 | 0 | 0 | 0 | 0 | 0 | 0 | 0 | 0 | 0 | 0 | 0 | 0 | 0 | 1 |
| $t_4$ | 0 | 0 | 1 | 0 | 1 | 0 | 0 | 0 | 0 | 0 | 0 | 0 | 0 | 0 | 0 | 0 | 0 | 0 |
| $t_5$ | 1 | 1 | 0 | 1 | 0 | 1 | 0 | 0 | 0 | 0 | 0 | 0 | 0 | 0 | 0 | 0 | 0 | 0 |
| $t_6$ | 1 | 1 | 1 | 0 | 1 | 0 | 1 | 0 | 0 | 0 | 0 | 0 | 0 | 0 | 0 | 0 | 0 | 1 |
| $t_7$ | 1 | 1 | 1 | 1 | 0 | 1 | 0 | 1 | 0 | 0 | 0 | 0 | 0 | 0 | 0 | 0 | 0 | 0 |
| $t_8$ | 0 | 0 | 1 | 1 | 1 | 0 | 1 | 0 | 1 | 0 | 0 | 0 | 0 | 0 | 0 | 0 | 0 | 0 |
| $t_9$ | 1 | 1 | 0 | 1 | 1 | 1 | 0 | 1 | 0 | 1 | 0 | 0 | 0 | 0 | 0 | 0 | 0 | 0 |
| $t_{10}$ | 1 | 1 | 1 | 0 | 1 | 1 | 1 | 0 | 1 | 0 | 1 | 0 | 0 | 0 | 0 | 0 | 0 | 0 |
| $t_{11}$ | 0 | 0 | 1 | 1 | 0 | 1 | 1 | 1 | 0 | 1 | 0 | 1 | 0 | 0 | 0 | 0 | 0 | 1 |
| $t_{12}$ | 0 | 0 | 0 | 1 | 1 | 0 | 1 | 1 | 1 | 0 | 1 | 0 | 1 | 0 | 0 | 0 | 0 | 1 |
| $t_{13}$ | 1 | 1 | 0 | 0 | 1 | 1 | 0 | 1 | 1 | 1 | 0 | 1 | 0 | 1 | 0 | 0 | 0 | 0 |
| $t_{14}$ | 1 | 1 | 1 | 0 | 0 | 1 | 1 | 0 | 1 | 1 | 1 | 0 | 1 | 0 | 1 | 0 | 0 | 1 |
| $t_{15}$ | 0 | 0 | 1 | 1 | 0 | 0 | 1 | 1 | 0 | 1 | 1 | 1 | 0 | 1 | 0 | 1 | 0 | 0 |
| $t_{16}$ | 1 | 1 | 0 | 1 | 1 | 0 | 0 | 1 | 1 | 0 | 1 | 1 | 1 | 0 | 1 | 0 | 1 | 0 |
| $t_{17}$ | 1 | 1 | 1 | 0 | 1 | 1 | 0 | 0 | 1 | 1 | 0 | 1 | 1 | 1 | 0 | 1 | 0 | 0 |
| $t_{18}$ | 1 | 1 | 1 | 1 | 0 | 1 | 1 | 0 | 0 | 1 | 1 | 0 | 1 | 1 | 1 | 0 | 1 | 1 |
| $t_{19}$ | 1 | 1 | 1 | 1 | 1 | 0 | 1 | 1 | 0 | 0 | 1 | 1 | 0 | 1 | 1 | 1 | 0 | 0 |
| $t_{20}$ | 0 | 0 | 1 | 1 | 1 | 1 | 0 | 1 | 1 | 0 | 0 | 1 | 1 | 0 | 1 | 1 | 1 | 0 |
| $t_{21}$ | 0 | 0 | 0 | 1 | 1 | 1 | 1 | 0 | 1 | 1 | 0 | 0 | 1 | 1 | 0 | 1 | 1 | 1 |
| $t_{22}$ | 1 | 1 | 0 | 0 | 1 | 1 | 1 | 1 | 0 | 1 | 1 | 0 | 0 | 1 | 1 | 0 | 1 | 1 |
| $t_{23}$ | 0 | 0 | 1 | 0 | 0 | 1 | 1 | 1 | 1 | 0 | 1 | 1 | 0 | 0 | 1 | 1 | 0 | 0 |
| $t_{24}$ | 0 | 0 | 0 | 1 | 0 | 0 | 1 | 1 | 1 | 1 | 0 | 1 | 1 | 0 | 0 | 1 | 1 | 1 |

```
              0 1 1 0 1 0 0 1 1
      10101)01110101000000
             10101
             10000
             10101
              10110
              10101
                11000
                10101
                 11010
                 10101
                  1111 ····CRC
```

HDLC FRAME FORMAT

| F1 | AF | CF | IF | FCS | F2 |

F1, F2 : FLAG (01111110)      : 1 BYTE
AF     : ADDRESS FIELD        : 2 BYTES
CF     : CONTROL FIELD        : 1 OR 2 BYTE(S)
IF     : INFORMATION FIELD    : 260 BYTES AT MAXIMUM
FCS    : FCS FIELD            : 2 BYTES

FIG.18B PRIOR ART

| | DI | \multicolumn{16}{c|}{NODES} | DO |
|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 | |
| $t_0$ | | 0 | 0 | 0 | 0 | 0 | 0 | 0 | 0 | 0 | 0 | 0 | 0 | 0 | 0 | 0 | 0 | |
| $t_1$ | 1 | 1 | 0 | 0 | 0 | 0 | 0 | 0 | 0 | 0 | 0 | 0 | 0 | 0 | 0 | 0 | 0 | 0 |
| $t_2$ | 0 | 0 | 1 | 0 | 0 | 0 | 0 | 0 | 0 | 0 | 0 | 0 | 0 | 0 | 0 | 0 | 0 | 0 |
| $t_3$ | 1 | 1 | 0 | 1 | 0 | 0 | 0 | 0 | 0 | 0 | 0 | 0 | 0 | 0 | 0 | 0 | 0 | 0 |
| $t_4$ | 0 | 0 | 1 | 0 | 1 | 0 | 0 | 0 | 0 | 0 | 0 | 0 | 0 | 0 | 0 | 0 | 0 | 0 |
| $t_5$ | 0 | 0 | 0 | 1 | 0 | 1 | 0 | 0 | 0 | 0 | 0 | 0 | 0 | 0 | 0 | 0 | 0 | 0 |
| $t_6$ | 1 | 1 | 0 | 0 | 1 | 0 | 1 | 0 | 0 | 0 | 0 | 0 | 0 | 0 | 0 | 0 | 0 | 0 |
| $t_7$ | 0 | 0 | 1 | 0 | 0 | 1 | 0 | 1 | 0 | 0 | 0 | 0 | 0 | 0 | 0 | 0 | 0 | 0 |
| $t_8$ | 0 | 0 | 0 | 1 | 0 | 0 | 1 | 0 | 1 | 0 | 0 | 0 | 0 | 0 | 0 | 0 | 0 | 0 |
| $t_9$ | 0 | 0 | 0 | 0 | 1 | 0 | 0 | 1 | 0 | 1 | 0 | 0 | 0 | 0 | 0 | 0 | 0 | 0 |
| $t_{10}$ | 0 | 0 | 0 | 0 | 0 | 1 | 0 | 0 | 1 | 0 | 1 | 0 | 0 | 0 | 0 | 0 | 0 | 0 |
| $t_{11}$ | 1 | 1 | 0 | 0 | 0 | 0 | 1 | 0 | 0 | 1 | 0 | 1 | 0 | 0 | 0 | 0 | 0 | 0 |
| $t_{12}$ | 1 | 1 | 1 | 0 | 0 | 0 | 0 | 1 | 0 | 0 | 1 | 0 | 1 | 0 | 0 | 0 | 0 | 0 |
| $t_{13}$ | 0 | 0 | 1 | 1 | 0 | 0 | 0 | 0 | 1 | 0 | 0 | 1 | 0 | 1 | 0 | 0 | 0 | 0 |
| $t_{14}$ | 1 | 1 | 0 | 1 | 1 | 0 | 0 | 0 | 0 | 1 | 0 | 0 | 1 | 0 | 1 | 0 | 0 | 0 |
| $t_{15}$ | 0 | 0 | 1 | 0 | 1 | 1 | 0 | 0 | 0 | 0 | 1 | 0 | 0 | 1 | 0 | 1 | 0 | 0 |
| $t_{16}$ | 0 | 0 | 0 | 1 | 0 | 1 | 1 | 0 | 0 | 0 | 0 | 1 | 0 | 0 | 1 | 0 | 1 | 0 |
| $t_{17}$ | 0 | 1 | 0 | 0 | 1 | 0 | 0 | 1 | 0 | 0 | 0 | 0 | 1 | 1 | 0 | 1 | 0 | 1 |
| $t_{18}$ | 1 | 1 | 1 | 0 | 0 | 1 | 0 | 0 | 1 | 0 | 0 | 0 | 0 | 1 | 1 | 0 | 1 | 0 |
| $t_{19}$ | 0 | 1 | 1 | 1 | 0 | 0 | 0 | 0 | 1 | 0 | 0 | 0 | 1 | 1 | 1 | 0 | 1 |
| $t_{20}$ | 0 | 0 | 1 | 1 | 1 | 0 | 0 | 0 | 0 | 1 | 0 | 0 | 0 | 1 | 1 | 1 | 0 |
| $t_{21}$ | 1 | 0 | 0 | 1 | 1 | 1 | 0 | 0 | 0 | 0 | 1 | 0 | 1 | 0 | 1 | 1 | 1 |
| $t_{22}$ | 1 | 0 | 0 | 0 | 1 | 1 | 0 | 1 | 0 | 0 | 0 | 1 | 1 | 1 | 0 | 1 | 1 |
| $t_{23}$ | 0 | 1 | 0 | 0 | 0 | 1 | 0 | 0 | 1 | 0 | 0 | 0 | 0 | 1 | 1 | 0 | 1 |
| $t_{24}$ | 1 | 1 | 1 | 0 | 0 | 0 | 1 | 0 | 0 | 1 | 0 | 0 | 0 | 0 | 0 | 1 | 1 | 0 |

|  | DI | 1 | 2 | 3 | 4 | 5 | 6 | 7 | 8 | 9 | 10 | 11 | 12 | 13 | 14 | 15 | 16 | DO |
|---|---|---|---|---|---|---|---|---|---|---|---|---|---|---|---|---|---|---|
| t 0 |   | 0 | 0 | 0 | 0 | 0 | 0 | 0 | 0 | 0 | 0 | 0 | 0 | 0 | 0 | 0 | 0 |   |
| t 1 | 1 | 1 | 0 | 0 | 0 | 0 | 1 | 0 | 0 | 0 | 0 | 0 | 1 | 0 | 0 | 0 | 0 | 1 |
| t 2 | 0 | 0 | 1 | 0 | 0 | 0 | 0 | 1 | 0 | 0 | 0 | 0 | 0 | 1 | 0 | 0 | 0 | 0 |
| t 3 | 1 | 1 | 0 | 1 | 0 | 0 | 1 | 0 | 1 | 0 | 0 | 0 | 1 | 0 | 1 | 0 | 0 | 1 |
| t 4 | 0 | 0 | 1 | 0 | 1 | 0 | 0 | 1 | 0 | 1 | 0 | 0 | 0 | 1 | 0 | 1 | 0 | 0 |
| t 5 | 0 | 1 | 0 | 1 | 0 | 1 | 1 | 0 | 1 | 0 | 1 | 0 | 0 | 1 | 0 | 1 | 0 | 1 |
| t 6 | 1 | 1 | 1 | 0 | 1 | 0 | 0 | 1 | 0 | 1 | 0 | 1 | 0 | 1 | 1 | 0 | 1 | 1 |
| t 7 | 0 | 1 | 1 | 1 | 0 | 1 | 1 | 0 | 1 | 0 | 1 | 0 | 1 | 1 | 1 | 1 | 0 | 1 |
| t 8 | 0 | 0 | 1 | 1 | 1 | 0 | 1 | 1 | 0 | 1 | 0 | 1 | 0 | 1 | 1 | 1 | 1 | 0 |
| t 9 | 0 | 1 | 0 | 1 | 1 | 1 | 1 | 1 | 1 | 0 | 1 | 0 | 1 | 1 | 1 | 1 | 1 | 1 |
| t 10 | 0 | 1 | 1 | 0 | 1 | 1 | 0 | 1 | 1 | 1 | 0 | 1 | 0 | 0 | 1 | 1 | 1 | 1 |
| t 11 | 1 | 0 | 1 | 1 | 0 | 1 | 1 | 0 | 1 | 1 | 1 | 0 | 1 | 0 | 0 | 1 | 1 | 0 |
| t 12 | 1 | 0 | 0 | 1 | 1 | 0 | 1 | 1 | 0 | 1 | 1 | 1 | 0 | 1 | 0 | 0 | 1 | 0 |
| t 13 | 0 | 1 | 0 | 0 | 1 | 1 | 1 | 1 | 1 | 0 | 1 | 1 | 1 | 1 | 0 | 0 | 0 | 1 |
| t 14 | 1 | 1 | 1 | 0 | 0 | 1 | 0 | 1 | 1 | 1 | 0 | 1 | 1 | 0 | 1 | 1 | 0 | 1 |
| t 15 | 0 | 0 | 1 | 1 | 0 | 0 | 1 | 0 | 1 | 1 | 1 | 0 | 1 | 1 | 0 | 1 | 1 | 0 |
| t 16 | 0 | 1 | 0 | 1 | 1 | 0 | 1 | 1 | 0 | 1 | 1 | 1 | 0 | 0 | 1 | 0 | 1 | 1 |
| t 17 | 0 | 1 | 1 | 0 | 1 | 1 | 1 | 1 | 1 | 0 | 1 | 1 | 1 | 1 | 0 | 1 | 0 | 1 |
| t 18 | 1 | 1 | 1 | 1 | 0 | 1 | 0 | 1 | 1 | 1 | 0 | 1 | 1 | 0 | 1 | 0 | 1 | 1 |
| t 19 | 0 | 1 | 1 | 1 | 1 | 0 | 0 | 0 | 1 | 1 | 1 | 0 | 1 | 0 | 0 | 1 | 0 | 1 |
| t 20 | 0 | 0 | 1 | 1 | 1 | 1 | 0 | 0 | 0 | 1 | 1 | 1 | 0 | 1 | 0 | 0 | 1 | 0 |
| t 21 | 1 | 0 | 0 | 1 | 1 | 1 | 1 | 0 | 0 | 0 | 1 | 1 | 1 | 0 | 1 | 0 | 0 | 0 |
| t 22 | 1 | 1 | 0 | 0 | 1 | 1 | 0 | 1 | 0 | 0 | 0 | 1 | 1 | 0 | 0 | 1 | 0 | 1 |
| t 23 | 0 | 0 | 1 | 0 | 0 | 1 | 1 | 0 | 1 | 0 | 0 | 0 | 1 | 1 | 0 | 0 | 1 | 0 |
| t 24 | 1 | 0 | 0 | 1 | 0 | 0 | 1 | 1 | 0 | 1 | 0 | 0 | 0 | 1 | 1 | 0 | 0 | 0 |

FIG.19C  PRIOR ART

ERROR CHECK CODE GENERATING DEVICE AND TRANSMISSION ERROR DETECTING DEVICE

BACKGROUND OF THE INVENTION

1. Field of the Invention

The present invention relates generally to error check code generating devices and transmission error detecting devices, and more particularly, to an error check code generating device and a transmission error detecting device which can be formed to have a regular layout on a semiconductor substrate. The present invention has particular applicability to a data transmitting apparatus and a data receiving apparatus which adopt the frame check sequence recommended by the Community Consultative International Telephone and Telecommunications (referred to as CCITT hereinafter).

2. Description of the Background Art

In transmitting data, data error control is indispensable. Because a data error can occur in various portions of a data transmission system, a technique is required to detect the error and collect it. The cyclic redundancy check (referred to as CRC hereinafter) code method has been known as one of such techniques. When this CRC code method is applied to a data transmission system, a data error can be detected on a data receiving side. Furthermore, it is possible for the system to self-correct the data containing an error under a certain condition. The CRC code method will be described in brief below.

In the following description, data D which is represented, for example, by the following expression (1) will be described by an equation (2)

$$D = 011101010 \ldots \quad (1)$$

$$D(X) = X^7 + X^6 + X^5 + X^3 + X^3 + X^1 \ldots \quad (2)$$

Therefore, data D (X) can be generally described as follows.

$$D(X) = \sum_{i=0}^{m} a_i \cdot X^i \quad (3)$$

First, an operation by means of module 2 (referred to as mod 2 hereinafter) for obtaining a CRC code will be described. It is assumed that, for example, data D (X) to be transmitted is represented by the expression (2) and a generating polynomial G (X) represented by the following expression (4) is applied.

$$\begin{aligned} G(X) &= 10101 \\ &= X^4 + X^2 + X^0 \end{aligned} \quad (4)$$

In order to generate a CRC code of 4 bits, the data D (X) is multiplied by $X^4$, the product of which is divided by the generating polynomial G (X). FIG. 17A shows how this division is preformed.

As shown in FIG. 17A, the remainder obtained through this division, i.e. "1111" represents a CRC code. This CRC code CRC (X) is described by the following expression.

$$CRC(X) = X^3 + X^2 + X^1 + X^0 \ldots \quad (5)$$

In transmitting data, transmission data TX (X) having the code CRC (X) added to the preceding data D (X) will be applied on a transmission line. The transmission data TX (X) is, therefore, described by the following expression.

$$\begin{aligned} TX(X) &= 0111010101111 \\ &= (X^7 + X^6 + X^5 + X^3 + X^1) \cdot \\ & X^4 + X^3 + X^2 + X^1 + X^0 \\ &= D(X) \cdot X^4 + CRC(X) \end{aligned} \quad (6)$$

The transmission data applied to the transmission line is received by a receiving apparatus. The received data RX (X) which may include a transmission error is represented by the following expression (7), i.e.:

$$RX(X) = D'(X) \cdot X^4 + CRC'(X) \ldots \quad (7)$$

where the data D, (X) corresponds to the data D (X) in the expression (6) and CRC' (X) corresponds to CRC (X) therein.

Transmission error detection in the receiving apparatus will be performed as follows. Initially, the data D' (X) is applied to the division in FIG. 17A instead of the data D (X), thereby to obtain a CRC code CRC" (X). When the received CRC' (X) coincides with CRC" (X) obtained through this operation, it is determined that there exists no transmission error. If any discrepancy is detected therebetween, which means that there has occurred a transmission error.

Generally, when data D (X) of any data length is transmitted with an additional CRC code CRC (X) of n bits, the transmission data TX (X) is represented by the following expression.

$$TX(X) = D(X) \cdot X^n + CRC(X) \ldots \quad (8)$$

Besides the transmission error detection using the CRC code above, the frame check sequence (referred to as FCS hereinafter) has been known as an error detection code based on the recommendations by the CCITT. This FCS is among error detection codes for the high level data link control (referred to as HDLC hereinafter) signal and defined by the CCITT as follows.

That is, a FCS code FCS (X) is given by the following expression.

$$FCS(X) = CRC1(X) + CRC2(X) \ldots \quad (9)$$

In order to obtain CRC1 (X), data D (X) having m bits to be transmitted is first multiplied by $X^{16}$, the product of which is divided by the following generating polynomial G (X), leaving CRC1 (X) as remainder (16 bits).

$$G(X) = X^{16} + X^{12} + X^5 + X^0 \ldots \quad (10)$$

CRC2 (X) can be obtained as remainder (16 bits) of the division performed on $X^m \cdot (X^{15} + X^{14} + \ldots + X^2 + X^1 + X^0)$ through the generating polynomial G (X).

The FCS code obtained through the expression (9) is, as in the case of the CRC code, added to the data D (X) to be transmitted, and applied on a transmission line therewith as transmission data TX (X).

A receiving apparatus receives the transmission data from a transmitting apparatus as received data RX (X). In order to detect any transmission error in the receiving apparatus, the received data is processed in a similar way as used in the case of the CRC code.

It is here assumed that the received data RX (X) is described by the following expression.

$$RX(X) = D'(X) \cdot X^{16} + FCS'(X) \ldots \quad (11)$$

Initially, the data D' (X) is multiplied by $X^{16}$, the product of which is divided by the generating polynomial G (X) thereby to obtain CRC1". Then, successive 16 bits of "1" are multiplied by $X^{m'}$ (m' represents figure number of the data D' (X)), the product of which is divided by the generating polynomial G (X) thereby to obtain CRC2". By applying CRC1" and CRC2" to the expression (9) above, FCS" (X) can be obtained. By comparing the received FCS' (X) with FCS" (X) obtained through operation, transmission error can be detected. In other words, if there can be seen coincidence between the two codes, non-existence of transmission error is determined, and if not, existence of transmission error is detected.

FIG. 17B is a conceptional illustration for explaining transmission and reception of a HDLC signal. Referring to FIG. 17B, a HDLC transmitting apparatus 90 and an HDLC receiving apparatus 94 are connected through transmission lines 91 and 93. There is shown a layer 1 (92) between the transmission lines 91 and 93 which has been recommended by the CCITT. A HDLC signal applied from the transmitting apparatus 90 on the transmission line 91 is transmitted on the transmission line 93 through the layer 1 (92).

FIG. 17C is a format representation for explaining a frame format of an HDLC signal. Referring to FIG. 17C, F1 represents opening flag (1 byte). AF represents address field (2 byte). CF represents control field (1 or 2 bytes). IF represents information (data) field (260 bytes at maximum). FCS represents FCS frame (2 bytes). F2 represents closing flag (1 byte). The opening flag F1 and the closing flag F2 are predetermined to be "01111110".

When the HDLC signal is to be transmitted, the above-mentioned FCS (X) is generated by applying data D (X) comprising the address field AF, the control field CF and the information field IF to the above-described generating method for FCS. The fields AF, CF and IF, and FCS are transmitted with the opening flag F1 and the closing flag F2 at their opposite ends.

When the HDLC transmitting apparatus 90 shown in FIG. 17B transmits a HDLC signal, it inserts "0" immediately after every successive five "1"s in the fields AF, CF and IF, and FCS so as to distinguish the data in the flags F1 and F2 from the others. Meanwhile, the HDLC receiving apparatus 94 deletes the "0" s inserted immediately after the every successive five "1"s. When the HDLC transmitting apparatus 90 has no data to be transmitted, it applies successive "1"s or a successive flag pattern to the transmission line. This is referred to as "time fill".

In order to generate the CRC code or the FCS code, divisions as previously described are necessary so that a division circuit is employed. Furthermore, another division circuit is provided in the receiving apparatus so as to detect transmission error.

Figures 18B, 18C:
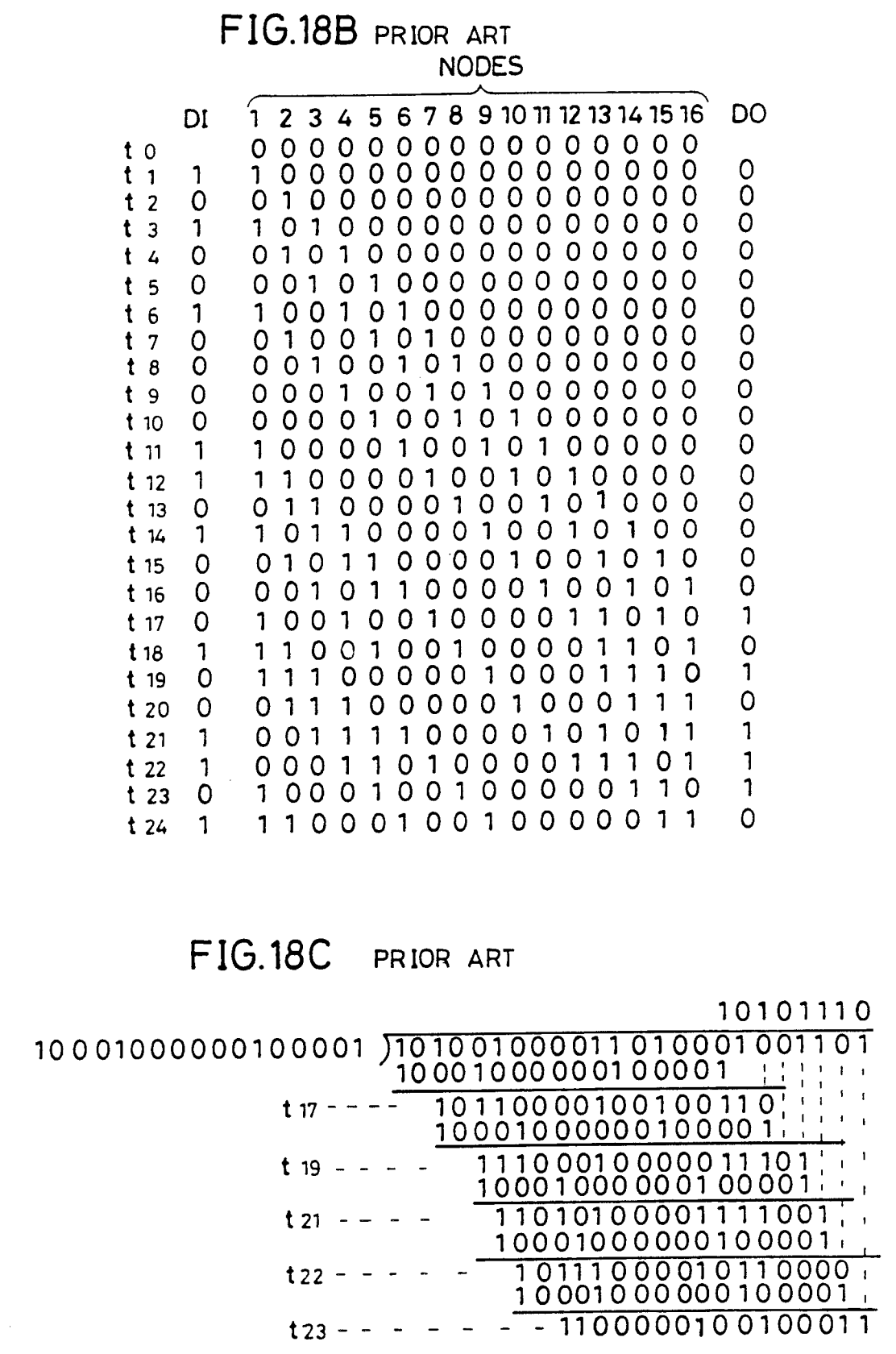

FIG. 18A is a circuit diagram showing an example of the conventional division circuits. Referring to FIG. 18A, this division circuit comprises shift registers 1 through 5 in successive five stages (or cascade-connected over five stages), shift registers 6 through 12 in successive seven stages, shift registers 13 through 16 in successive four stages, EXOR gates 95 and 96 interposed between the successive shift register groups, and an EXOR gate 97 connected to receive input data DI and output data DO.

FIG. 18B is a timing chart for explaining operation of the division circuit shown in FIG. 18A. FIG. 18C is an operation diagram according to which the operation is performed in the operation circuit. The operation of this division circuit will be described below.

The division circuit shown in FIG. 18A performs a division (mod 2) on input data DI by means of the generating polynomial G (X) given by the expression (10). Description will be now made on a case where input data as described below is entered.

$$DI = 1010010000110100010011101 \ldots \quad (12)$$

In operation, all the shift registers 1 through 16 are reset at the time t0. Accordingly, nodes N1 through N17 shown in FIG. 18A show data of "0". The data DI are sequentially inputted during the time interval t1 to t24. The changes of data at the respective nodes N1 through N16 and the output data DO are shown in FIG, 18B.

When a comparison is made between FIG. 18B and FIG. 8C, it can be seen that the successive 16- bits of "0" are outputted as data DO before quotient of the division is outputted as output data DO. Furthermore, the remainders at each stage in FIG. 18C coincide with the values of the shift registers at the times of t17, t19, t21, t22 and t23, respectively, as shown in FIG. 18B. The quotient of the division performed on the data DI through the generating polynomial G (X) is obtained as an output value of the shift registers at the time of t24. Therefore, it will be understood that the division circuit shown in FIG. 18A operates just according to the process shown in FIG. 18C.

FIG. 19A is a circuit diagram showing another example of the conventional division circuits. Referring to FIG. 19A, what is different from the division circuit shown in FIG. 18A is that an EXOR gate 98 is connected to the circuit instead of the EXOR gate 97.

FIG. 19B is a timing chart for explaining operation of the division circuit shown in FIG. 19A. FIG. 19C is an operation diagram according to which the division circuit performs the operation. The operation of this division circuit will be described below.

As in the case described above, the shift registers 1 through 16 are all reset at the time t0. Input data DI are entered during the time interval t1 through t24.

When a comparison is made between FIG. 19B and FIG. 19C a quotient obtained through a division on output data DO is outputted. The remainders at each stage shown in FIG. 19C do not coincide with the values of the shift registers shown in FIG. 19B except at the time of t24 where the entire input data DI has been entered. This means that a CRC code can be obtained at the time t24.

When the CRC code is obtained using the circuit shown in FIG. 18A, it is necessary to enter successive 16 bits of "0" following the input data DI. When the division circuit shown in FIG. 19A is employed, however, the CRC code can be obtained at the time (t24) when the entire input data DI has been entered so that it is possible for the circuit to generate the CRC code earlier by 16 clock cycles than the circuit of FIG. 18A.

Therefore, such a division circuit as shown in FIG. 19A has been generally used to generate the CRC code.

Since in the conventional error check code generating devices and transmission error detecting devices, such division circuits as shown in FIG. 19A have been employed, the layout thereof on a semiconductor chip is irregular. In other words, the EXOR gates 95 and 96 are interposed between the shift register groups so that there cannot be seen any continuity in the layout. Additionally, only those error detection circuits have been known which are based on a specific generating polynomial G (X).

SUMMARY OF THE INVENTION

An object of the present invention is to regularize the circuit layout on a semiconductor substrate in a data transmitting apparatus which adds error check bits to the data bits and the transmits them together.

Another object of the present invention is to provide a data transmitting apparatus which adds the FCS bits to the data bits and then transmits them together.

Still another object of the present invention is to regularize the circuit layout on a semiconductor substrate in a transmission error detecting device.

Still another object of the present invention is to provide a transmission error detecting circuit which can process a transmission signal having the FCS bits added thereto.

Briefly stated, an error check code generating device according to the present invention comprises shift registers in predetermined n stage (n is integer), an initial value setting circuit for setting given initial values for each shift register in the n stages, first coincidence detection circuit for detecting coincidence between an output signal of the n-th shift register and an output signal of a predetermined i-th shift register (i <n, i is integer), second coincidence detection circuit for detecting coincidence between an output signal of the first coincidence detection circuit and an output of a predetermined j-th shift register (j<i, j is integer), third coincidence detection circuit for detecting coincidence between an output signal of the second coincidence detection circuit and data to be transmitted. The first shift register is connected to receive an output signal from the third coincidence detection circuit. Furthermore, this error check code generating device comprises fourth coincidence detection circuit for detecting coincidence between an input signal of the first shift register and an output signal of the second coincidence detection circuit.

According to another aspect of the present invention, a transmission error detecting device comprises a receiving circuit for receiving a transmission signal having an error check code added to data to be transmitted, which has been obtained through an operation based on a given generating polynomial, shift registers in predetermined n stages (n is integer), an initial value setting circuit for setting given initial values for each shift register in the n stages, first coincidence detection circuit for detecting coincidence between an output signal of the n-th shift register and an output signal of a predetermined i-th shift register (i<n, i is integer), second coincidence detection circuit for detecting coincidence between an output signal of the first coincidence detection circuit and an output signal of a predetermined j-th shift register (j<i, j is integer), and third coincidence detection circuit for detecting coincidence between an output signal of the second coincidence detection circuit and a received signal which has been received by the receiving circuit. The first shift register is connected to receive an output signal from the third coincidence detection circuit. Furthermore, this transmission error detecting device comprises fourth coincidence detection circuit for detecting coincidence among input signals entered in the respective shift registers in the n stages.

When the error check code generating device and the transmission error detecting device operate, the initial value setting circuits preset given initial values in each of the shift registers in the n stages. The shift registers in the n stages, and the first, second and third coincidence detection circuits constitute an operation circuit based on a given generating polynomial. Since there cannot be connected any circuit element between the successive shift registers in the n stages, regular circuit layouts on semiconductor substrates can be obtained in these error check code generating device and transmission error detecting device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1D is a timing chart for explaining operation of the FCS decoder shown in FIG. 1C.

FIG. 6B is a timing chart for explaining operation of the CRC decoder shown in FIG. 6A.

FIG. 7B is a timing chart for explaining operation of the division circuit shown in FIG. 7A.

FIG. 8B is a timing chart for explaining operation of the multiplication circuit shown in FIG. 8A.

FIG. 18B is a timing chart for explaining operation of the division circuit shown in FIG. 18A.

FIG. 18C is an operation diagram according to which the division circuit shown in FIG. 18A operates.

FIG. 19B is a timing chart for explaining operation of the division circuit shown in FIG. 19A.

FIG. 19C is an operation diagram according to which the division circuit shown in FIG. 19A operates.

DESCRIPTION OF THE PREFERRED EMBODIMENTS

Figure 2:
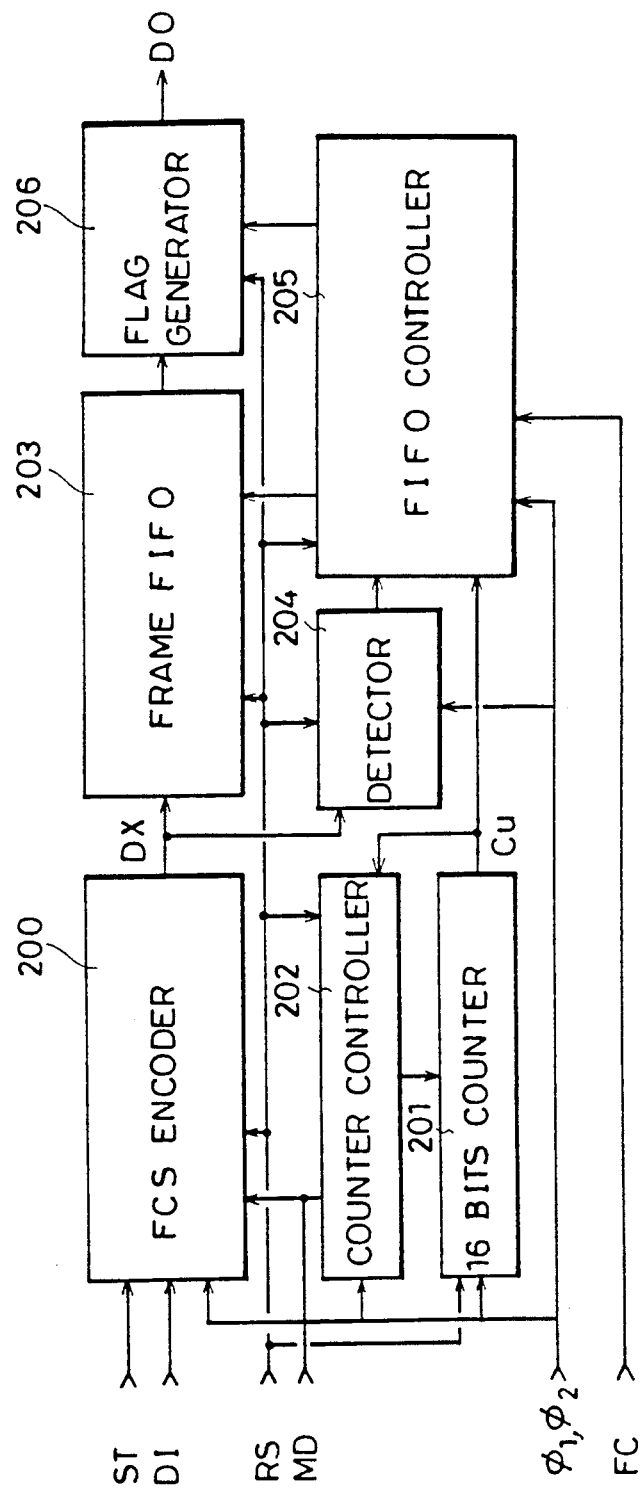
FIG. 2 is a block diagram showing an example of transmitting apparatus applicable as a HDLC transmitting apparatus.

FIG. 2 is a block diagram showing an example of transmitting apparatus applicable as an HDLC transmitting apparatus. Referring to FIG. 2, the transmitting apparatus comprises an FCS encoder 200, a 16 bits counter 201, a counter controller 202, a frame FIFO memory 203, a detector 204 for detecting successive five "1"s, an FIFO controller 205, and a flag generator 206. In the transmitting apparatus, a FCS code is generated and then added to data to be transmitted. Additionally, a function for interposing "0" after successive "1"s if they are contained in the data, and another function for adding an opening flag and a closing flag thereto are provided in the transmitting apparatus.

In operation, two-phase non-overlap clock signals $\phi 1$ and $\phi 2$ are externally applied to the transmitting apparatus on a constant basis. Initially, a reset signal RS is applied to reset the transmitting apparatus. A set signal ST is then applied to the FCS encoder 200 to set predetermined initial values in the shift registers (not shown) for 16 bits in the FCS encoder 200.

Furthermore, a mode signal MD is applied to the FCS encoder 200, and then input data DI comprising an address field, a control field and an information field as components of an HDLC signal is applied to the FCS encoder 200. The FCS encoder 200 operates in response to the clock signals $\phi 1$ and $\phi 2$ for applying the processed data, or data having an FCS code added therein to the frame FIFO memory 203 and the detector 204.

Immediately after the last bit of the input data DI has been entered, the mode signal MD falls off. The counter controller 202 is responsive to the fall of the signal MD for starting to drive the 16 bits counter 201. Accordingly, the FCS encoder 200 outputs an FCS code of 16 bits immediately after the signal MD has fallen. When the count value of the counter 201 has reached 16, the counter 201 applies a count up signal CU to the counter controller 202 and the FIFO controller 205. The counter controller 202 is responsive to this signal CU for resetting the 16 bit counter 201 to stop its operation.

The detector 204 detects existence of successive five "1"s contained in an output signal of the FCS encoder 200 to apply a detection signal to the FIFO controller 205. The FIFO controller 205 interpose "0" immediately after the successive five "1"s stored in the frame FIFO memory 203. Accordingly, data comprising an address field, a control field, an information field and an FCS field are outputted from the frame FIFO memory 203, after the "0" interposing process has been done if necessary. The data outputted from the frame FIFO memory 203 get an opening flag and a closing flag added to in the flag generator 206 before outputted as output data DO.

Figure 3:
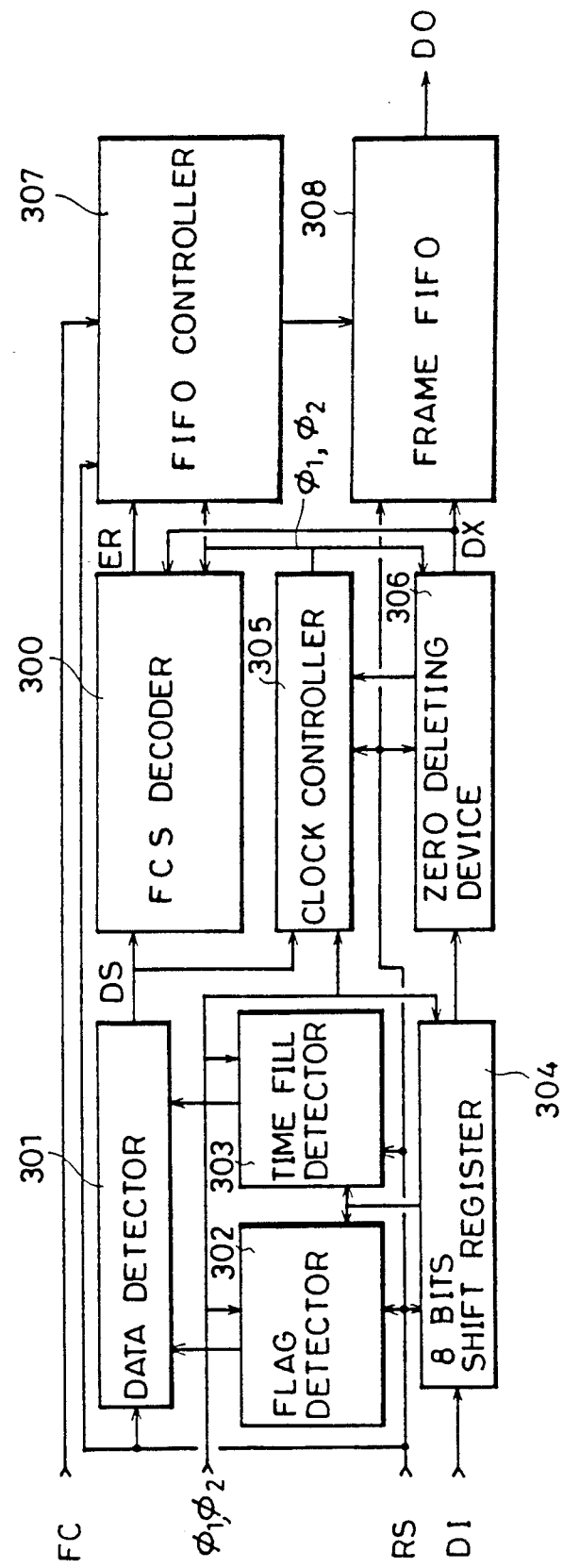
FIG. 3 is a block diagram showing an example of receiving apparatus applicable as an HDLC receiving apparatus.

FIG. 3 is a block diagram showing an example of receiving apparatus applicable as an HDLC receiving apparatus. Referring to FIG. 3, this receiving apparatus comprises a data detector 301, a flag detector 302, a time fill detector 303, a shift register 304 for 8 bits, an FCS decoder 300, a clock controller 305, a "0" deleting device 306, an FIFO controller 307, and a frame FIFO memory 308. Furthermore, this receiving apparatus has detecting and deleting functions for detecting and deleting an opening flag and a closing flag, a detecting function for detecting time fill, a "0" deleting function for deleting "0" interposed by the transmitting apparatus, and a transmission error detecting function.

In operation, two-phase non-overlap clock signals $\phi 1$ and $\phi 2$ are externally applied to the receiving apparatus on a constant basis. Initially, a reset signal RS is applied to the receiving apparatus to reset each circuit comprised in this receiving apparatus. Data DI obtained from a received signal are applied to the 8 bit shift register 304 as input data. The data stored in the shift register 304 are always monitored by the flag detector 302 and the time fill detector 303. The flag detector 302 detects a flag contained in the input data DI to apply a detection signal to the data detector 301. The time fill detector 303 also detects time fill contained in the input data DI to apply a detection signal to the data detector 301. When a flag is detected by the flag detector 302, the data detector 301 determines that the 8 bits data following the flag are necessary only if they are not flags nor time fill. The determining signal DS is applied to the FCS decoder 300 and the clock controller 305.

The clock controller 305 is connected to receive the clock signals $\phi 1$ and $\phi 2$. This clock controller 305 masks clock signals $\phi 1$ and $\phi 2$ only when a flag or an interposed "0" has been detected. The "0" deleting device 306 deletes the successive five "1"s contained in the successive address field, control field, information field and FCS field to apply the deleted data to the FCS decoder 300 and the frame FIFO memory 308.

The FCS decoder 300 receives the data from which "0" has been deleted and detects existence of a transmission error which might have occurred on the transmission line to apply a detection signal ER to the FIFO controller 307. The FIFO controller 307 applies a clock signal and a control signal to the FIFO memory 308 for controlling the same. The frame FIFO memory 308 receives data comprising an address field, a control field and an information field through the "0" deleting device 306 to provide output data DO.

Figure 1A:
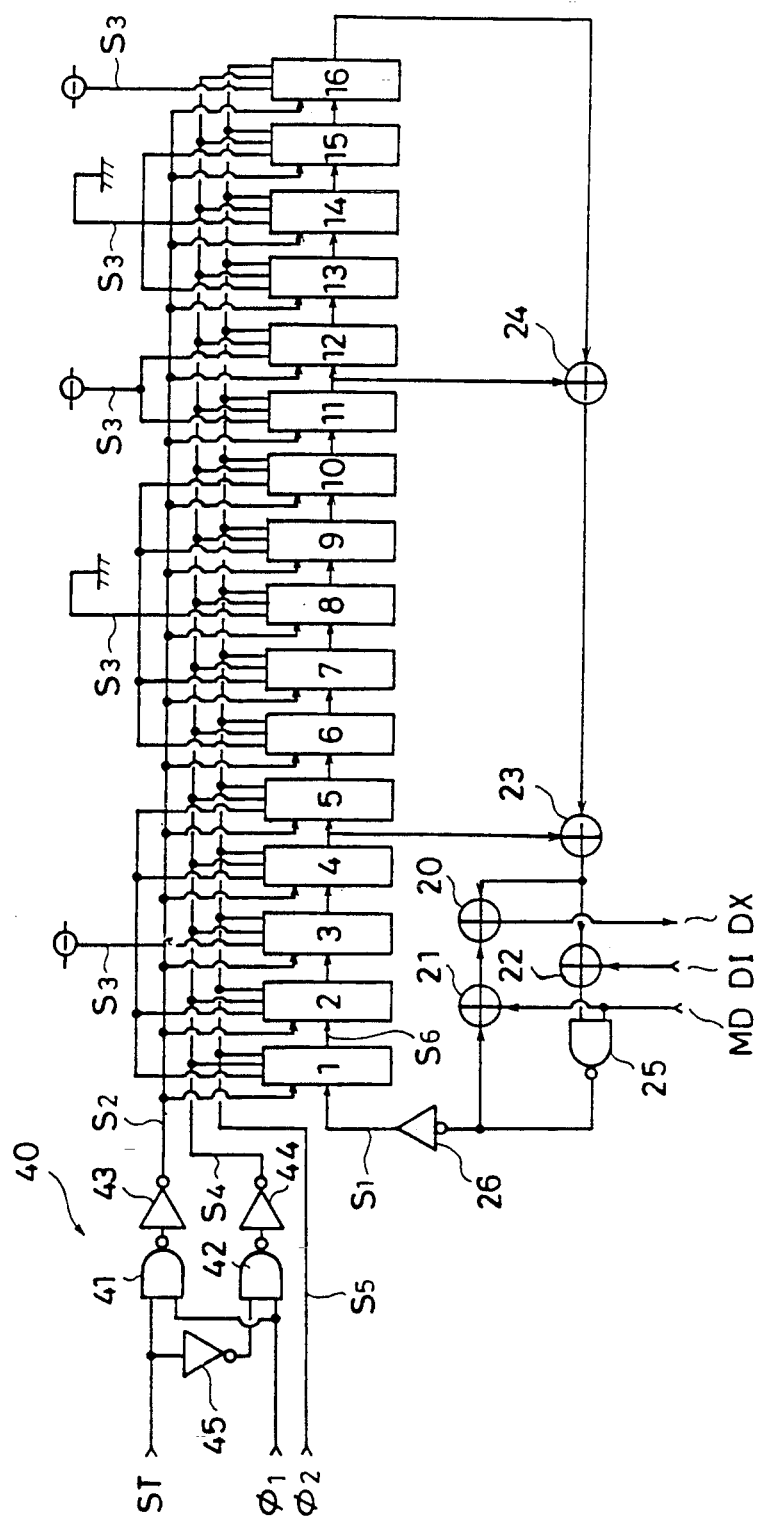
FIG. 1A is a circuit diagram of an FCS encoder according to an embodiment of the present invention.

FIG. 1A is a circuit diagram according to an embodiment of the present invention, which corresponds to the FCS encoder 200 shown in FIG. 2. Referring to FIG. 1A, the FCS encoder comprises shift registers 1 through 16 cascade-connected over 16 stages, a gate circuit 40 for a control signal, EXOR gates 20 through 24, a NAND gate 25, and an inverter 26. The gate circuit 40 comprises NAND gates 41 and 42, and inverters 43 and 45. The gate circuit 40 is connected to receive a set signal ST and a clock signal $\phi 1$. The shift registers 1 through 16 are each connected to receive a clock signal $\phi 2$. The EXOR gate 21 and the NAND gate 25 are each connected to receive a mode signal MD. Input data DI comprising an address field, a control field and an information field is applied to an input of the EXOR gate 22. The data of an FCS field (FCS code) is outputted through the EXOR gate 20.

Figure 1B:
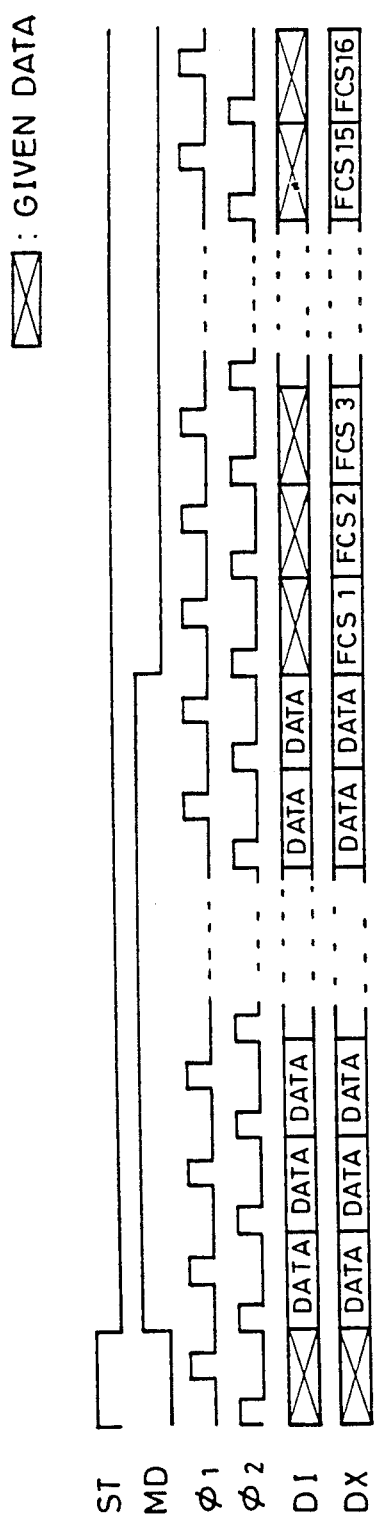
FIG. 1B is a timing chart for explaining operation of the FCS encoder shown in FIG. 1A.

FIG. 1B is a timing chart for explaining operation of the FCS encoder shown in FIG. 1A. Referring to FIGS. 1A and 1B, the operation of the encoder will be described below.

Initially, a set signal ST of a logically high level is applied to the gate circuit 40 to set initial values shown by the following expression (13) in each of the shift registers 1 through 16.

shift registers 1 through 16={1111100000110001}... (13)

At this moment, the mode signal MD is at a logically low level. After the initial values are set in the shift registers 1 through 16, the mode signal MD rises. At the same time, input data DI comprising an address field, a control field and an information field which will be components of an HDLC signal is applied to the EXOR gate 22. The input data DI is entered in the transmitting apparatus in synchronization with the two-phase clock signals $\phi 1$ and $\phi 2$. Until the mode signal MD begins to fall, the entered input data DI are sequentially outputted as output data DX.

After the last bit of the input data is entered, the mode signal MD falls off. After the signal MD has fallen, any 16 bits data are entered as another input data DI. During the period in which the 16 bits data are applied, FCS codes 1 through 16 of 16 bits are outputted as output data DX from the XOR gate 20.

Figure 4B:
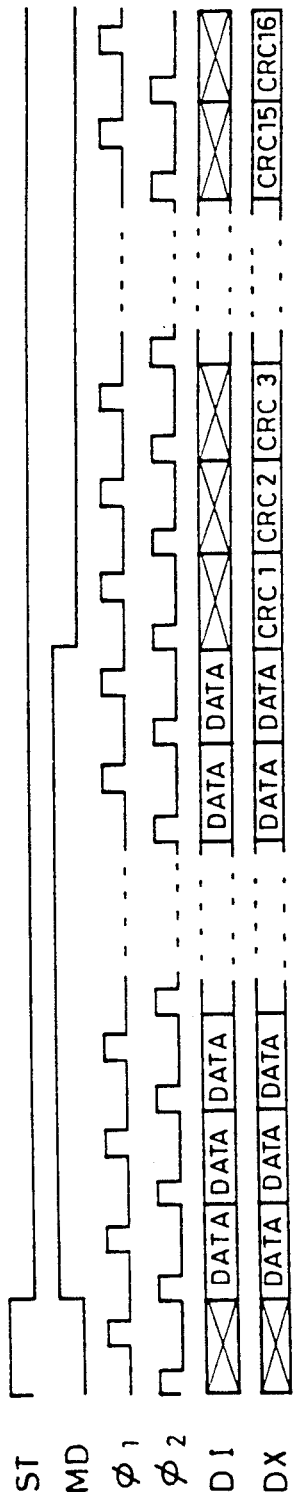
FIG. 4B is a timing chart for explaining operation of the CRC encoder shown in FIG. 4A.
Figure 4A:
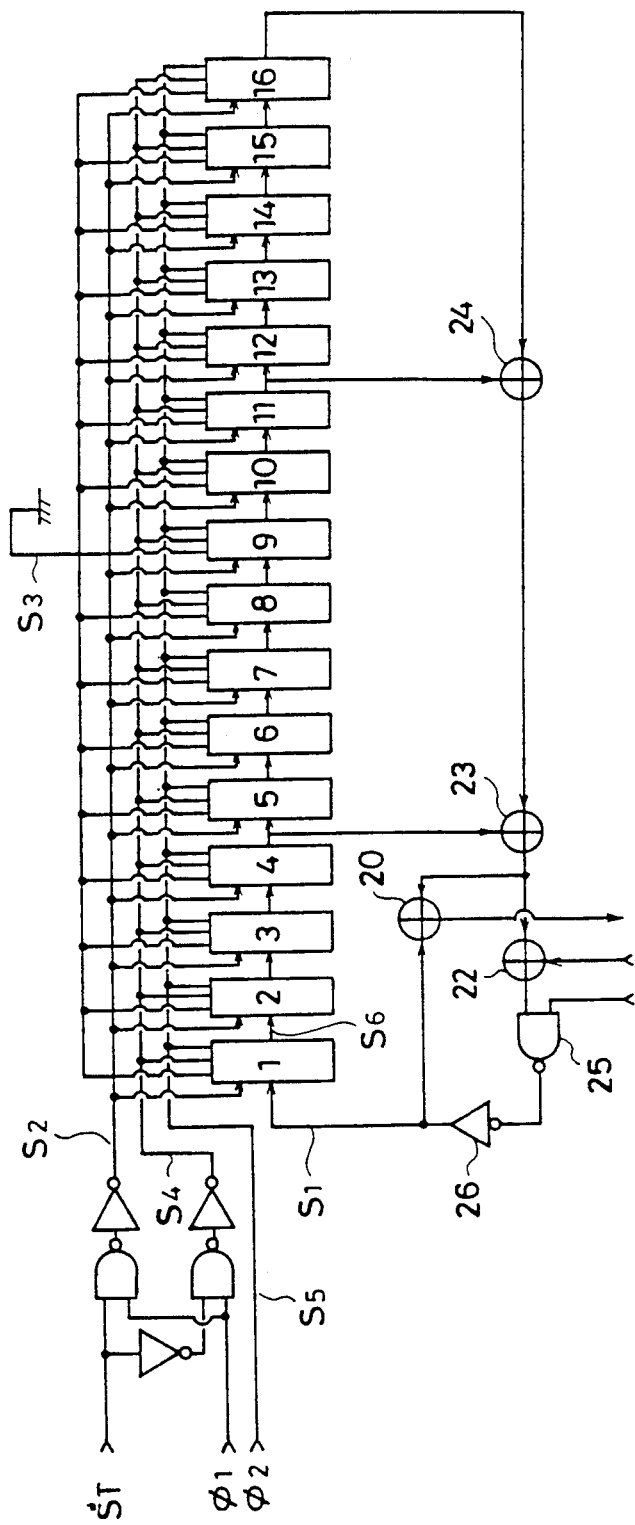
FIG. 4A is a circuit diagram of a CRC encoder according to another embodiment of the present invention.

FIG. 4A is a circuit diagram showing a CRC encoder according to another embodiment of the present invention. BY substituting this CRC encoder for the FCS encoder 200 shown in FIG. 2, a transmitting apparatus capable of adding a CRC code to the data can be obtained. Referring to FIG. 4A, in this CRC encoder, the EXOR gate 21 shown in FIG. 1A as a part of the FCS encoder is not provided and all the interconnections for applying initial values to each of the shift registers 1 through 16 are grounded.

FIG. 4B is a timing chart for explaining operation of the CRC encoder shown in FIG. 4A. Referring to FIGS. 4A and 4B, the operation of the encoder will be described below.

Initially, a set signal ST of a logically high level is applied to enter "0" in each of the shift registers 1 through 16 as initial values. At this moment, the mode signal MD is at a low level. The mode signal MD then begins to rise, so that input data DI. is applied to the EXOR gate 22. Since the operation following this is the same as in the FCS encode except that CRC codes 1 through 16 are added to the preceding data bits instead of the FCS codes 1 through 16, the description will not be repeated here.

Figure 5:
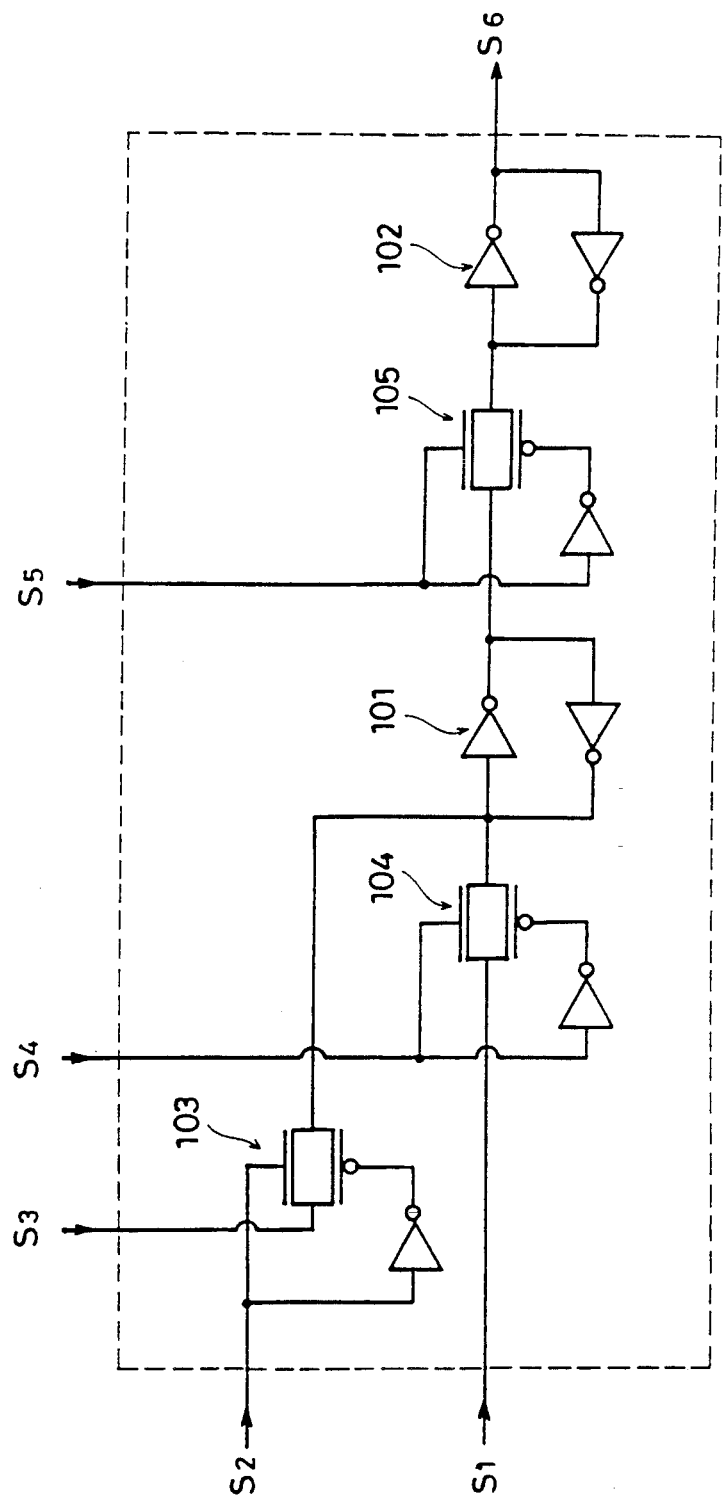
FIG. 5 is a circuit diagram showing an example of shift register.

FIG. 5 is a circuit diagram showing an example of shift register which can be applied to the FCS encoder shown in FIG. 1A and the CRC encoder shown in FIG. 4A. Referring to FIG. 5, the shift register comprises flip-flops 101 and 102 each comprising two inverters, and three transmission gates 103 through 105. The reference numerals of input signals S1 through S5 to be entered in this shift register and an output signal S6 thereof are given also in FIGS. 1A and 4A where the shift register is applied to the FCS encoder or the CRC encoder so that the correspondence therebetween may be clearly indicated. Meanwhile, the shift register shown in FIG. 5 can be also applied to an FCS decoder and a CRC decoder as will be described later.

Figure 1C:
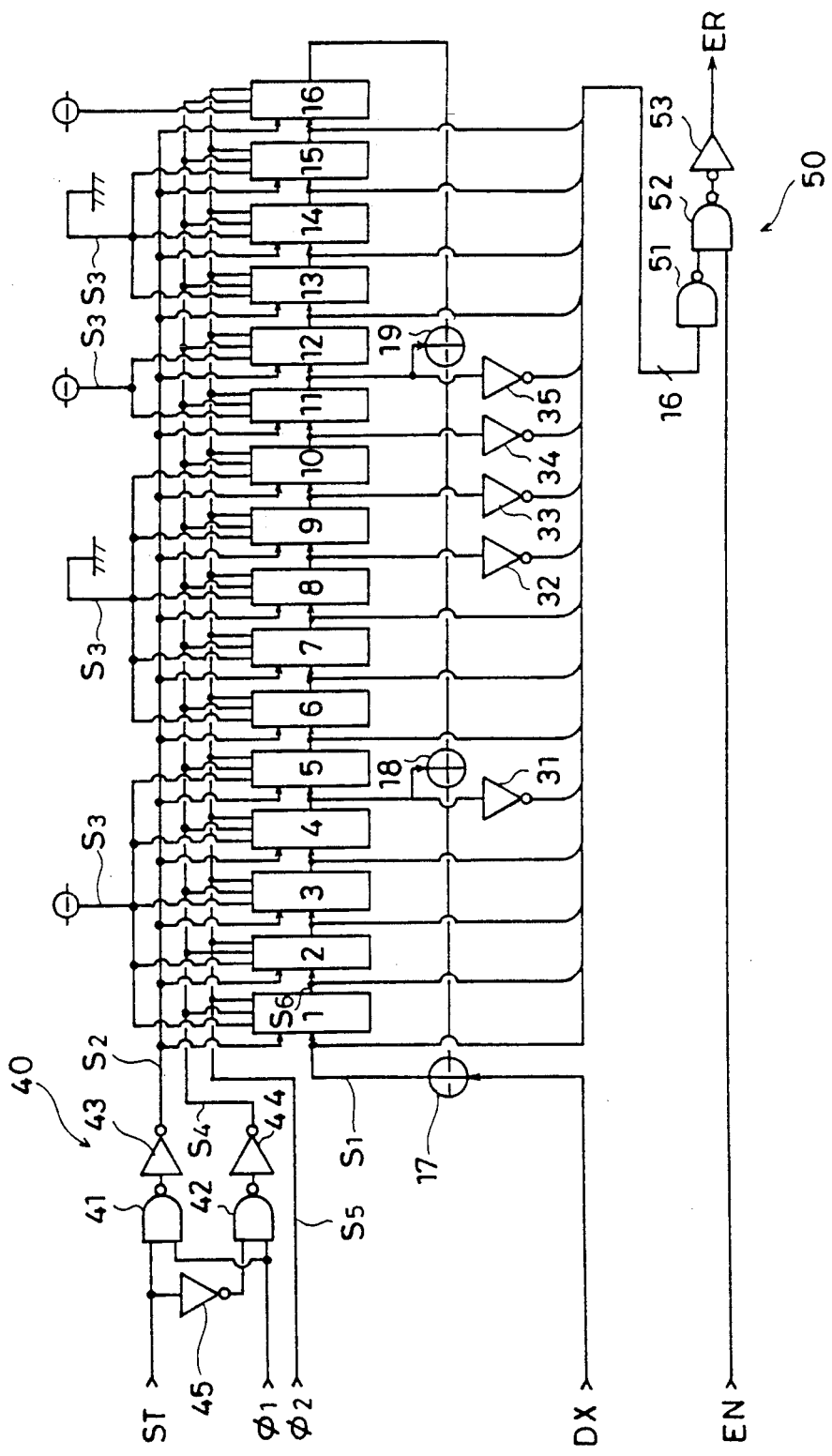
FIG. 1C is a circuit diagram of an FCS decoder according to an embodiment of the present invention.

FIG. 1C is a circuit diagram of an FCS decoder according to an embodiment of the present invention. The FCS decoder is employed in the HDLC receiving apparatus shown in FIG. 3 as a FCS decoder 300. Referring to FIG. 1C, the FCS decoder comprises shift registers 1 through 16 cascade-connected over 16 stages, a gate circuit 40 for a control signal, three EXOR gates 17 through 19, inverters 31 through 35, and a detection circuit 50 responsive to input signals from the respective shift registers 1 through 16 for detecting a transmission error. The detection circuit 50 comprises a NAND gate 51 connected to receive input signals from the shift registers 1 through 16 in parallel, a NAND gate 52, and an inverter 53. The shift register shown in FIG. 5 is applied to each of the shift registers 1 through 16.

FIG. 1D is a timing chart for explaining operation of the FCS decoder shown in FIG. 1C. Referring to FIGS. 1C and 1D, the operation of the decoder will be described below.

Initially, a set signal ST of a high level is applied to enter the initial values given by the expression (13) above in each of the shift registers 1 through 16. At this moment, an enable signal EN for instructing transmission error detection is at a low level. Accordingly, an error signal ER which indicates the detection result is also at a low level. After the initial values are stored in the shift registers 1 through 16, input data DX comprising an address field, a control field, an information field and an FCS field which have been contained in a received signal is entered in the EXOR gate 17 in response to two-phase non-overlap clock signals $\phi 1$ and $\phi 2$. Therefore, the input data DX has additional FCS codes FCS1 through FCS 16 besides the data bits.

Immediately after the last bit of the FCS code, or FCS 16 is entered as input data DX, the enable signal EN begins to rise. The detection circuit 50 is responsive to the rise of the signal EN for outputting an error signal ER showing the detection result. A high level signal ER is outputted when any transmission error has been detected, while a low level signal ER is outputted when no transmission error has been detected. This is because when there has been no transmission error, the data contained in the shift registers 1 through 16 immediately after FCS16 has been entered is equal to the value given by the following expression (14).

shift registers 1 through 16={1111011100001111}... (14)

Figure 6A:
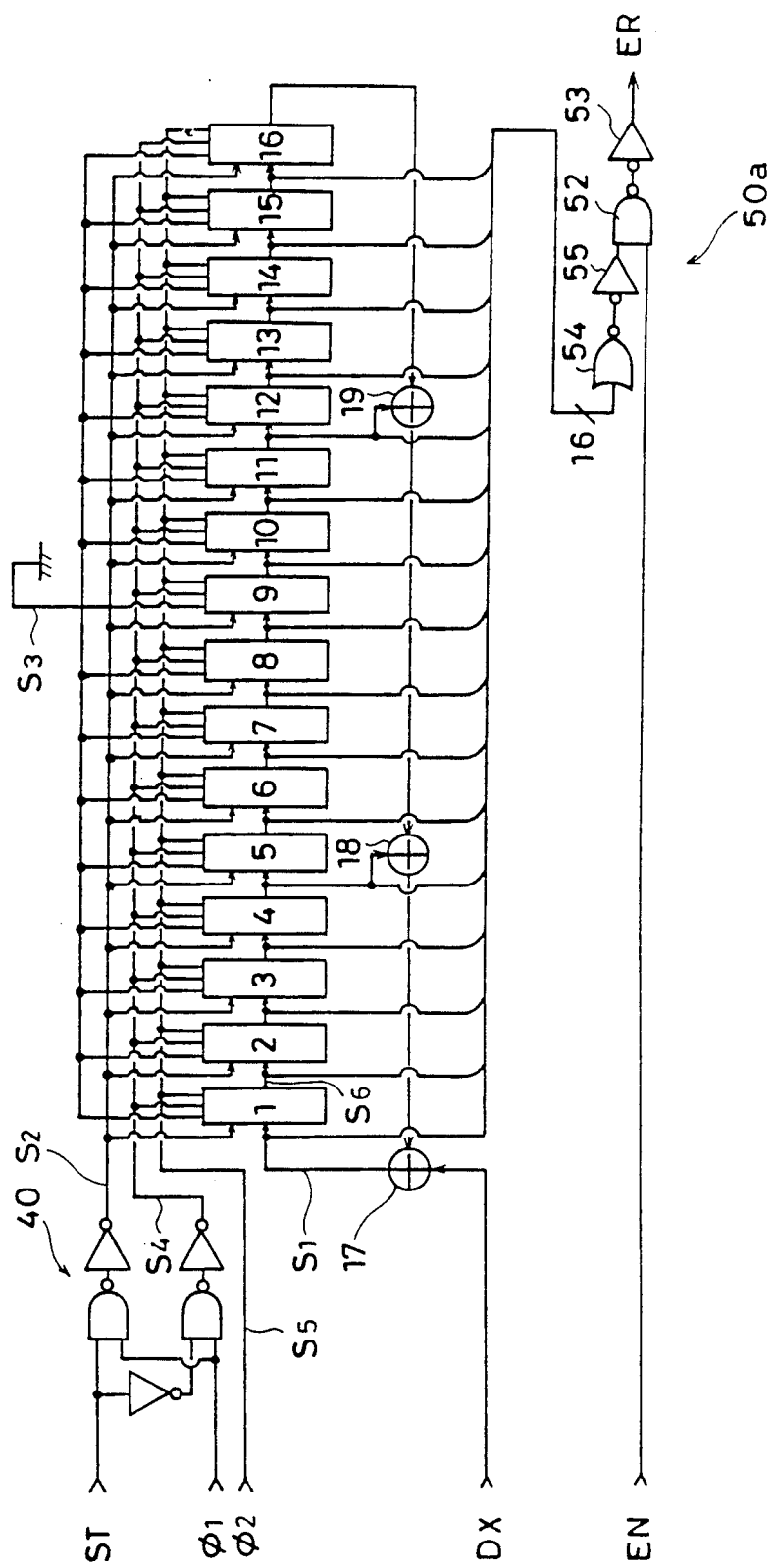
FIG. 6A is a circuit diagram of a CRC decoder according to another embodiment of the present invention.

FIG. 6A is a circuit diagram of a CRC decoder according to another embodiment of the present invention. By substituting this CRC decoder for the FCS decoder 300 shown in FIG. 3, transmission error can be detected from a received data having a CRC code added therein. Referring to FIG. 6A, in the CRC decoder, the inverters 31 through 35 shown in FIG. 1C as parts of the FCS decoder are not provided, and all the interconnections for setting initial values in the shift registers 1 through 16 are grounded. Additionally, a NOR gate 54 and an inverter 55 are connected to the decoder instead of the NAND gate 51 shown in FIG. 1A.

FIG. 6B is a timing chart for explaining operation of the CRC decoder shown in FIG. 6A. Referring to FIGS. 6A and 6B, the operation of the decoder will be described below.

Initially, a high level set signal ST is applied to store initial values of "0" in all the shift registers 1 through 16. At this moment, the enable signal EN is at a low level. Then, the set signal ST falls so that data contained in a received signal is applied to the EXOR gate 17 as input data DX. Since the operation following this is the same as in the FCS decoder shown in FIG. 1C, the description will not be repeated here. It is to be noted, however, CRC codes CRC1 through CRC 16 are added to the preceding data bits instead of FCS 1 through FCS 16 in this case.

Now, referring to FIGS. 7A through 9B, a division circuit and a multiplication circuit applied to the FCS encoder shown in FIG. 1A and the CRC encoder shown in FIG. 4A will be described.

Figure 7A:
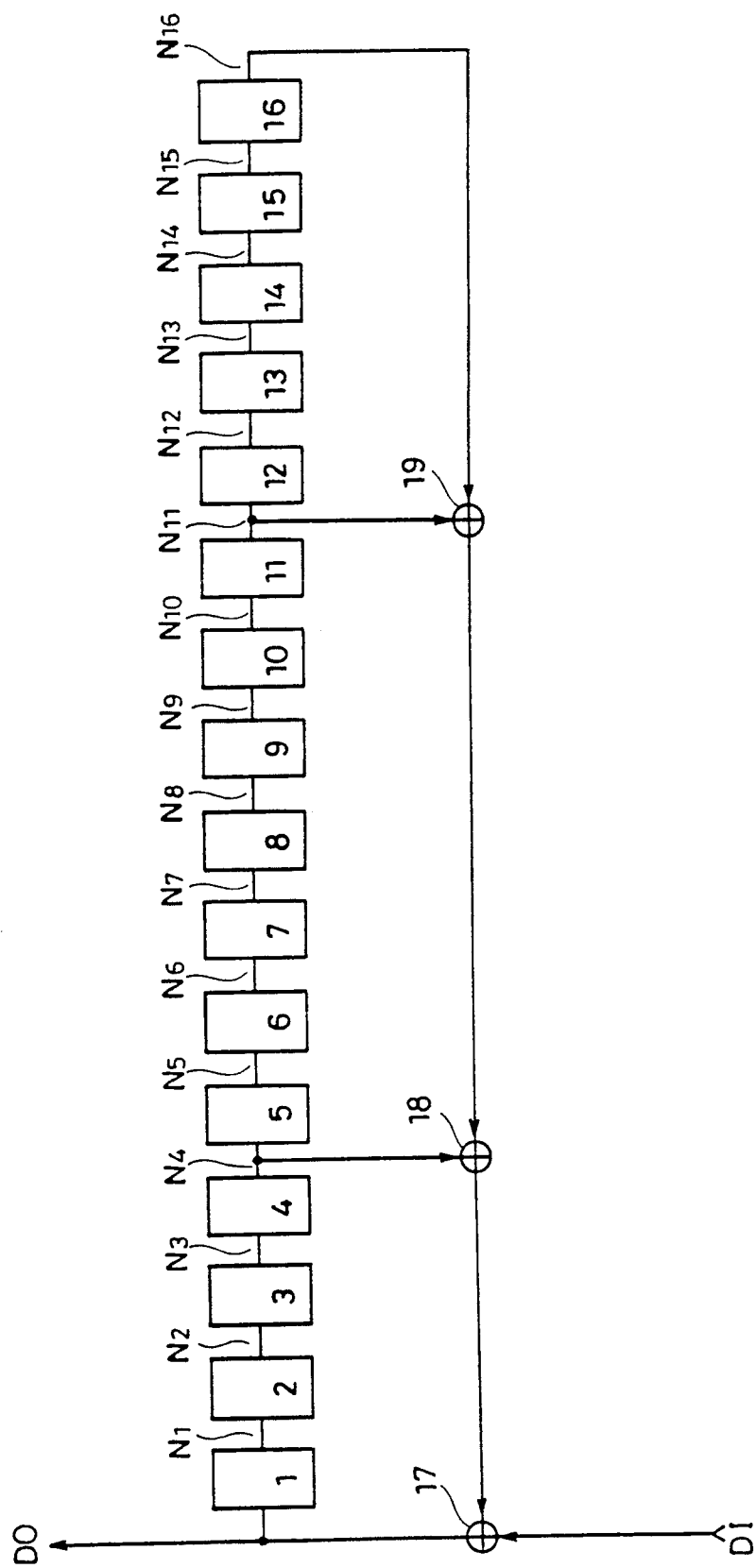
FIG. 7A is a circuit diagram of a division circuit.

FIG. 7A is a circuit diagram showing a division circuit. Referring to FIG. 7A, the division circuit comprises shift registers 1 through 16 cascade-connected over 16 stages, and EXOR gates 17 through 19.

FIG. 7B is a timing chart for explaining operation of the division circuit shown in FIG. 7A. Referring to FIGS. 7A and 7B, the operation of the division circuit will be described. In the following description, it is assumed that the data given by the expression (12) above is applied to the circuit as input data DI.

Initially, "0"s are applied to the shift registers 1 through 16 shown in FIG. 7A to reset them all. Then, during the time interval from t1 to t24, the input data DI is applied to the EXOR gate 17. The changes at the output nodes of the respective shift registers 1 through 16 during the time interval t0 through t24 are shown in FIG. 7B.

Figure 19A:
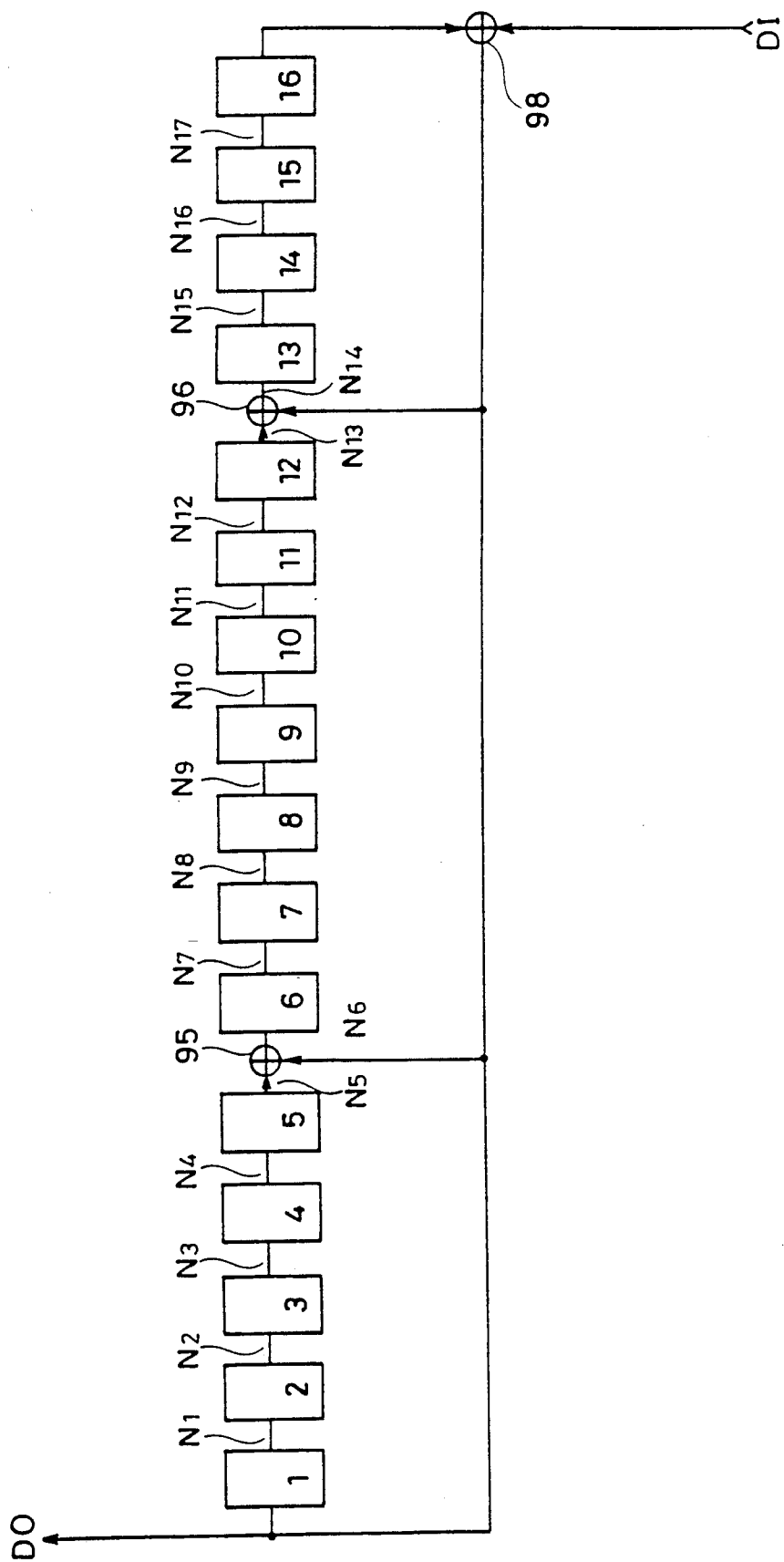
FIG. 19A is a circuit diagram showing another example of the conventional division circuits.
Figure 19C:
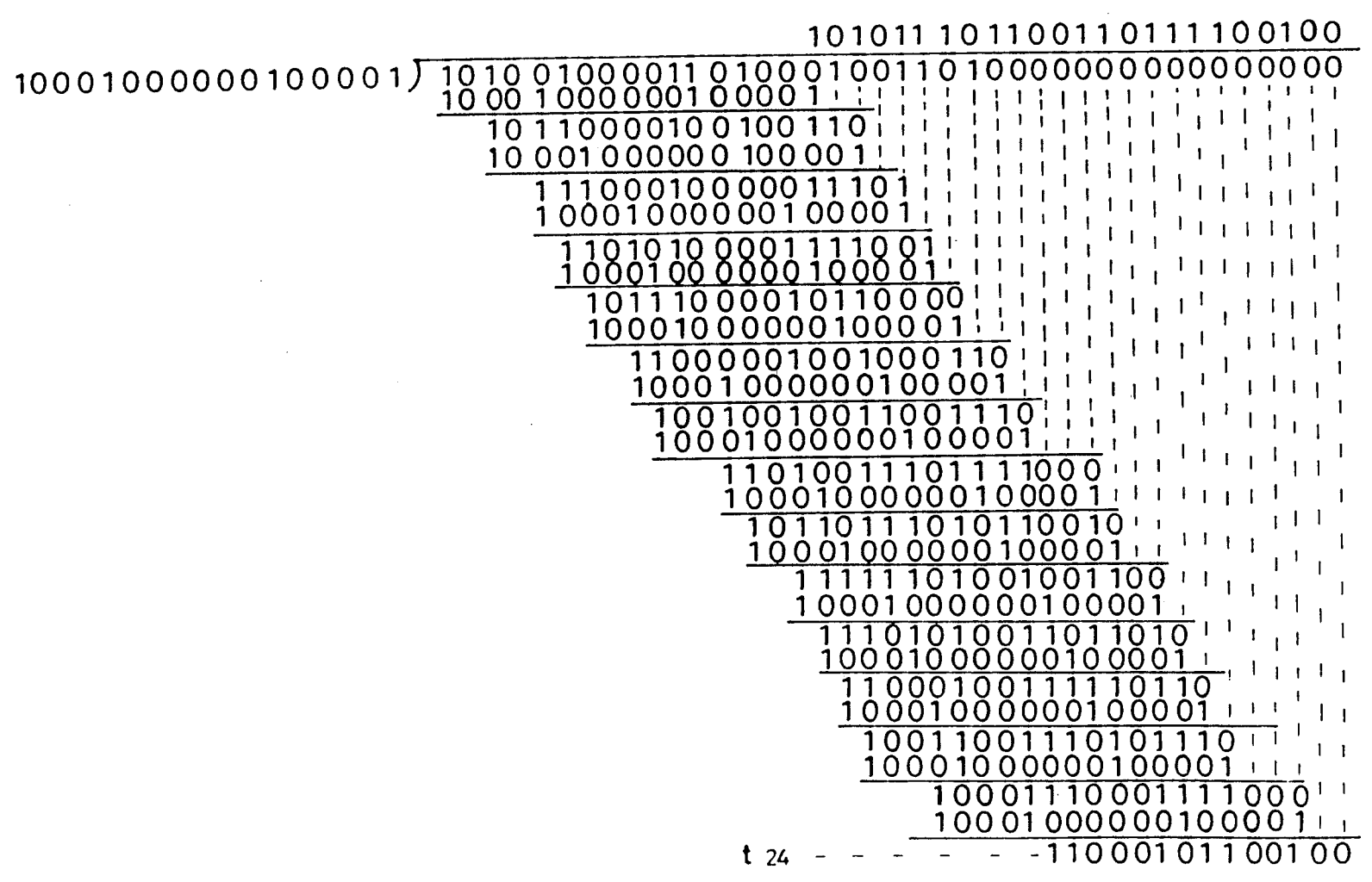

When a comparison is made between the operating diagram shown in FIG. 19C and the timing chart in FIG. 7B, it can be seen that the input data DI is first multiplied by $X^{16}$, the product of which is then divided through the generating polynomial D (X) thereby to output the resulting quotient as output data DO. As will be understood from the division circuit shown in FIG. 7A, the stored bits are not inverted through the shift operation by the respective shift registers 1 through 16. Accordingly, the quotient of the division performed on DI. $X^{16}$ through G (X) will be shifted through the shift registers 1 through 16.

Figure 8A:
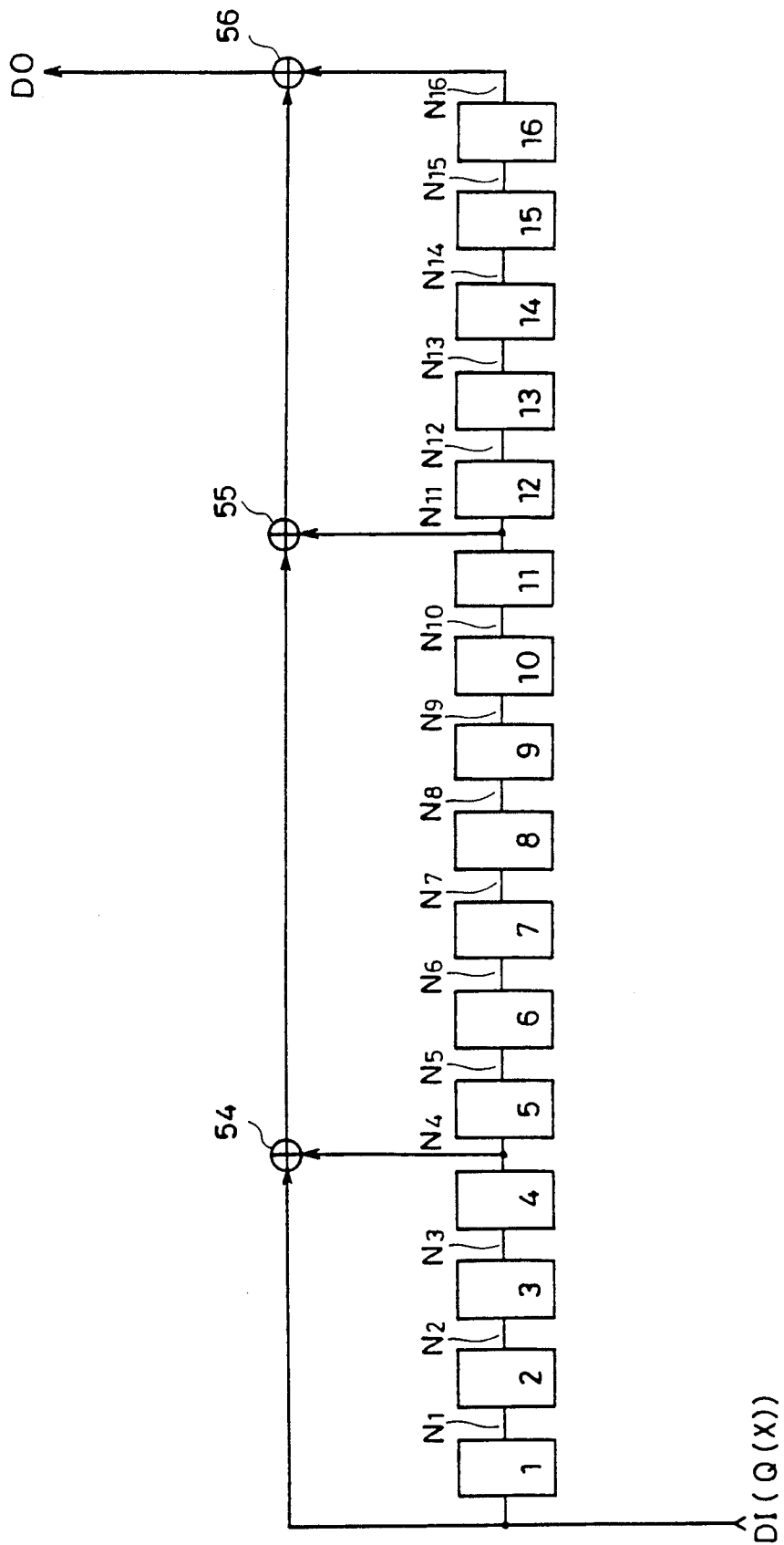
FIG. 8A is a circuit diagram of a multiplication circuit.

FIG. 8A is a circuit diagram showing a multiplication circuit. Referring to FIG. 8A, the multiplication circuit comprises shift registers 1 through 16 cascade-connected over 16, and EXOR gates 54 through 56.

FIG. 8B is a timing chart for explaining operation of the multiplication circuit shown in FIG. 8A. Referring to FIGS. 8A and 8B, the operation of the multiplication circuit will be described below.

It is here assumed that the quotient Q (X) obtained through the division circuit shown in FIG. 7A is entered in this multiplication circuit as input data DI. Therefore, Q (X) is described by the following expression (10).

$$Q(X) = 1010111011001101111100100 \qquad (15)$$

Initially, "0"s are stored in all the shift registers 1 through 16 in advance (at the time t0). Then, during the time interval from t1 to t24, the data Q (X) given by the expression (15) are applied to them as input data DI. The changes of data at the output nodes N1 through N16 of the respective shift registers 1 through 16 are shown in FIG. 8B with respect to the timer interval from t1 to t24.

As seen in FIG. 8B, the output data DO coincides with the input data DI given by the expression (12). Additionally, when a comparison is made between FIG. 7B and FIG. 8B, it is understood that the values of the shift registers 1 through 16 shown in FIG. 8A at each timing precisely coincide with those of the shift registers 1 through 16 shown in FIG. 7A at the corresponding timing. Accordingly, the CRC encoder shown in FIG. 9A can be obtained by combining the division circuit shown in FIG. 7A with the multiplication circuit in FIG. 8A.

Figure 9A:
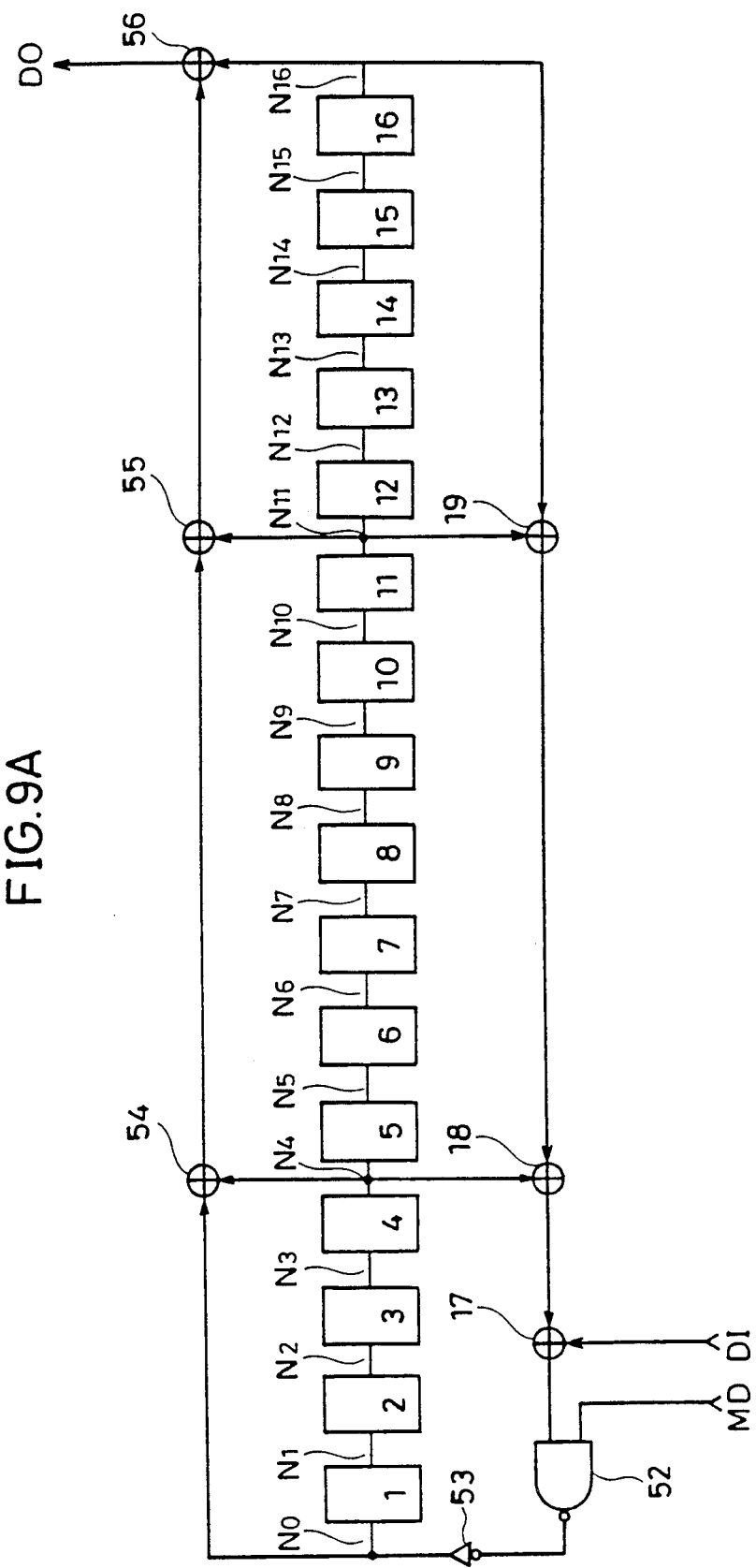
FIG. 9A is a circuit diagram showing another example of CRC encoder

Referring in FIG. 9A, the CRC encoder comprises shift registers 1 through 16 in 16 stages, EXOR gates 17 through 19, a NAND gate 52, an inverter 53, and EXOR gates 54 and 56.

In operation, "0"s are initially stored in all the shift registers 1 through 16. A high level mode signal MD is then applied to the NAND gate 52. When input data DI is applied to the XOR gate 17, quotient Q (X) of the division performed on DI·$X^{16}$ through G (X) is simultaneously obtained at the node N0. Bits of the quotient Q (X) are sequentially entered in the shift register 1, and the given quotient Q (X) is shifted toward the shift register 16, as shown in FIG. 7B. This means that the quotient Q (X) is entered in the multiplication circuit. Accordingly, the entered data are outputted as output data DO until the entry of the last bit of Q (X) in the shift register 1 is accomplished.

When the last bit of the quotient Q (X) has been entered, the mode signal MD begins to fall. Therefore, the node N0 is always held at "0" after the fall of the signal MD. As a result, 16 bits of "0" are sequentially applied to the shift register 1 so that 16 bits of a CRC code are outputted as output data DO.

In the CRC encoder shown in FIG. 9A, the output data DO can be obtained by adding together the respective data at the nodes N0, N4, N11 and N16 by means of mod 2. Therefore, the CRC encoder shown in FIG. 4A can be obtained by simplifying the circuit structure of the CRC encoder shown in FIG. 9A.

The CRC encoder shown in FIG. 4A will be now analyzed with the use of numerical expressions. The CRC encoder is constituted according to the generating polynomial G (X) described by the expression (10). When the product of data D (X) and $X^{16}$ is divided through G (X), quotient Q (X) and remainder CRC (X) can be obtained. Therefore, there can be seen a relationship described by the following expression:

$$(X) \cdot X^{16} = Q(X) \cdot G(X) + CRC(X) \ldots \qquad (16)$$

where + represents an addition according to mod 2 and · is an operator showing a multiplication according to mod 2.

When CRC (X) is added to the both sides of the expression (16) through addition according to mod 2, the following expression (17) can be obtained, i.e.:

$$D(X) \cdot X^{16} + CRC(X) = Q(X) \cdot G(X) \ldots \qquad (17)$$

where the left side represents data having a CRC code CRC (X) added to the preceding last bit of the serial data D (X). Therefore, the left side of the expression 17 can be obtained through multiplication of the quotient Q (X) and G (X).

Assuming that input data of the multiplication circuit is g (X) and output data thereof is f (X), f (X) is given by the following expression, i.e:

$$f(X) = g(X) \cdot G(X)/X^{16} \ldots \quad (18)$$

where / represents an operator of division according to mod 2.

When simultaneous equations (18) and (19) are solved under the condition defined by the following expression (19), an expression (20) can be obtained.

$$f(X) = D(X) \cdot X^{16} + CRC(X) \quad (19)$$
$$g(X) = Q(X) \cdot X^{16} \quad (20)$$

It is to be understood, therefore, that $D(X) \cdot X^{16} + CRC(X)$ can be obtained as output data DX if $Q(X) \cdot X^{16}$ is applied to the shift register 1 in the first stage.

Figure 9B:
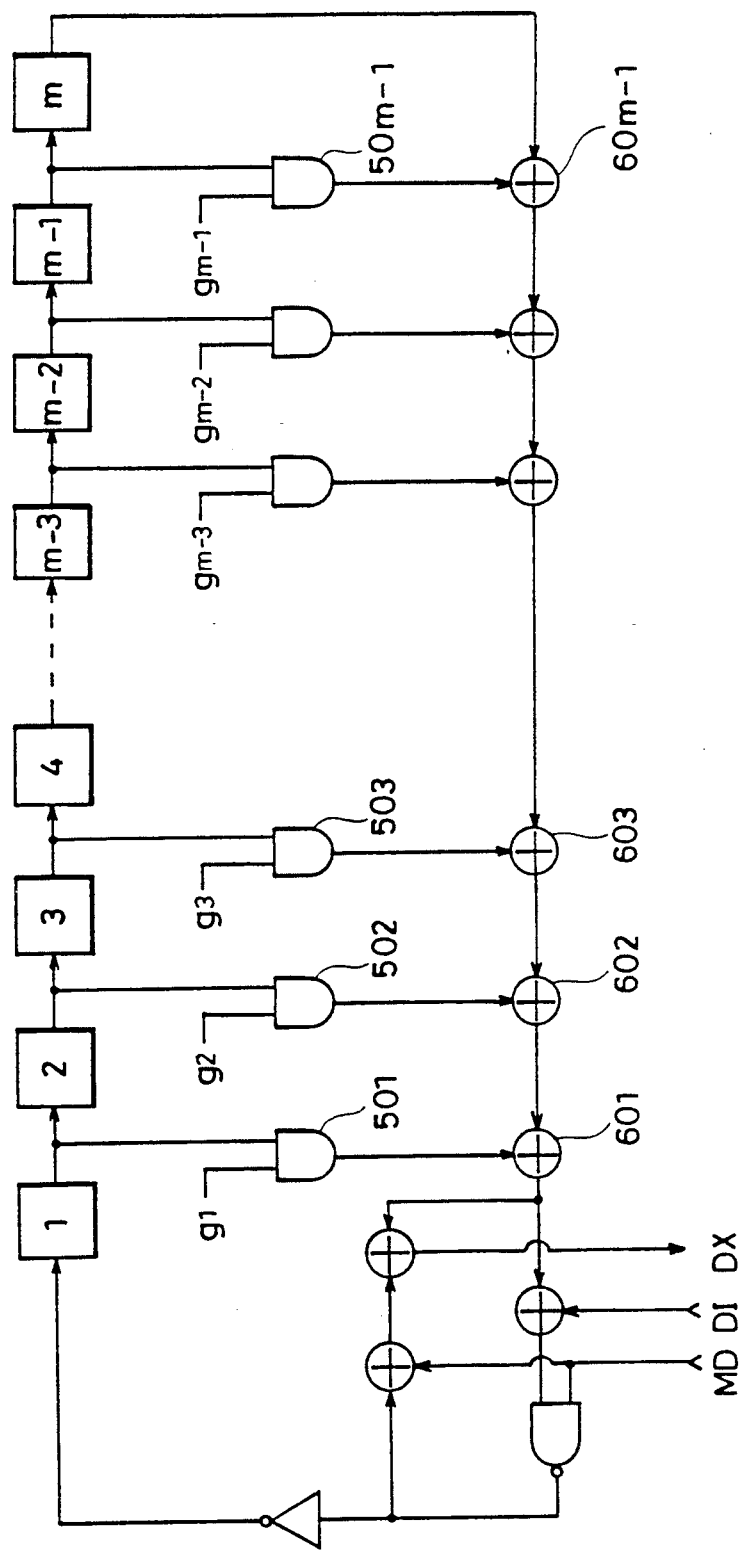
FIG. 9B is a circuit diagram of a generalized FCS encoder.

Now, with respect to a generalized FCS encoder, relation between the generating polynomial G (X) and the initial value to be set in the shift registers 1 through 16 will be described below. FIG. 9B is a circuit diagram showing a generalized FCS encoder. Referring to FIG. 9B, the FCS encoder comprises shift registers 1 through m in m stages, AND gate 501 through 50m-1 for selecting output signals of the shift registers 1 through m-1, and EXOR gates 601 through 60m-1 connected to the outputs of the AND gates 501 through 50m-1. In this diagram, selecting signals $g_1$ through $g_{m-1}$ are for selecting output signals of the shift registers 1 through m-1.

The generating polynomial G (X) can be generally described by the following expression:

$$G(X) = X^m \cdot \left( \sum_{i=1}^{m} g_i \cdot X^{-i} + X^{-m} + 1 \right) \quad (21)$$

where $g_i = 1$ or 0

If D (X) represents random data of n bits, the same is described by the following expression:

$$D(X) = \sum_{j=1}^{n} D_j \cdot X^{j-1} \quad (22)$$

where $D_j = 1$ or 0

Furthermore, if K (X) represents a fixed vector of m bits, the same is described by the following expression:

$$K(X) = \sum_{K=1}^{m} K_k \cdot X^{k-1} \quad (23)$$

where $K_k = 1$ or 0

If a division according to mod 2 is here performed on $X^m \cdot D(X)$ through the generating polynomial G (X), the resulting remainder CRC1 (X) is described by the following expression:

$$CRC1(X) = \sum_{l=1}^{m} CRC1_l \cdot X^{l-1} \quad (24)$$

where CRC1 $l = 1$ or 0

On the other hand, if a division according to mod 2 is performed on $K(X) \cdot X^n$ through the generating polynomial G (X), the resulting remainder CRC2 (X) is given by the following expression:

$$CRC2(X) = \sum_{h=1}^{m} CRC2_h \cdot X^{h-1} \quad (25)$$

where $CRC2_h = 1$ or 0

Thus, the FCS code FCS (X) is given by the following expression.

$$FCS(X) = \overline{CRC1(X) + CRC2(X)} \ldots \quad (26)$$

Accordingly, assuming that the initial values to be set in the shift registers 1 through m are $I_1$ through $I_m$ there can be seen a relation expressed by the following determinant (27).

$$\begin{pmatrix} K_1 \\ K_2 \\ K_3 \\ \cdot \\ \cdot \\ \cdot \\ K_{m-2} \\ K_{m-1} \\ K_m \end{pmatrix} = \quad (27)$$

$$\begin{pmatrix} I_1 & & & & & \\ I_2 & I_1 & & & & \\ I_3 & I_2 & I_1 & & & \\ \cdot & \cdot & \cdot & \cdot & & \\ \cdot & \cdot & \cdot & & \cdot & \\ \cdot & \cdot & \cdot & & & \cdot \\ I_{m-2} & I_{m-3} & I_{m-4} & \ldots & I_1 & \\ I_{m-1} & I_{m-2} & I_{m-3} & \ldots & I_2 & I_1 \\ I_m & I_{m-1} & I_{m-2} & \ldots & I_3 & I_2 & I_1 \end{pmatrix} \begin{pmatrix} 1 \\ g_{m-1} \\ g_{m-2} \\ \cdot \\ \cdot \\ \cdot \\ g_3 \\ g_2 \\ g_1 \end{pmatrix}$$

The FCS encoder shown in FIG. 1A will be described as an example to which the above determinant has been applied. That is, in the FCS recommended by the CCITT, there should be seen a relationship given by the following expressions.

$$\left.\begin{array}{l} m = 16 \\ K_1 = K_2 = \ldots = K_{16} = 1 \\ G(X) = X^{16}(X^{-4} + X^{-11} + X^{-16} + 1) \end{array}\right\} \quad (28)$$

More specifically, the generating polynomial G (X) is described by the relation given by the following expression.

$$\left.\begin{array}{l} g_{15} = 0, g_{14} = 0, g_{13} = 0, g_{12} = 0, g_{11} = 1, g_{10} = 0 \\ g_9 = 0, g_8 = 0, g_7 = 0, g_6 = 0, g_5 = 0 \ g_4 = 1 \\ g_3 = 0, g_2 = 0, g_1 = 0 \end{array}\right\} \quad (29)$$

If the relation given by the expressions (28) and (29) is applied to the determinant (27), the following expression (30) and thus initial values given by the expression (31) can be obtained. These initial values are employed in the FCS encoder shown in FIG. 1A.

$$\left.\begin{array}{l}
K_1 = 1 = I_1 \\
K_2 = 1 = I_2 \\
K_3 = 1 = I_3 \\
K_4 = 1 = I_4 \\
K_5 = 1 = I_5 \\
K_6 = 1 = I_6 + I_1 \\
K_7 = 1 = I_7 + I_2 \\
K_8 = 1 = I_8 + I_3 \\
K_9 = 1 = I_9 + I_4 \\
K_{10} = 1 = I_{10} + I_5 \\
K_{11} = 1 = I_{11} + I_6 \\
K_{12} = 1 = I_{12} + I_7 \\
K_{13} = 1 = I_{13} + I_8 + I_1 \\
K_{14} = 1 = I_{14} + I_9 + I_2 \\
K_{15} = 1 = I_{15} + I_{10} + I_3 \\
K_{16} = 1 = I_{16} + I_{11} + I_4
\end{array}\right\} \quad (30)$$

$$\left.\begin{array}{l}
I_1 = 1, I_2 = 1, I_3 = 1, I_4 = 1, I_5 = 1, I_6 = 0 \\
I_7 = 0, I_8 = 0, I_9 = 0, I_{10} = 0, I_{11} = 1, I_{12} = 1 \\
I_{13} = 0, I_{14} = 0, I_{15} = 0, I_{16} = 1
\end{array}\right\} \quad (31)$$

Figure 10:
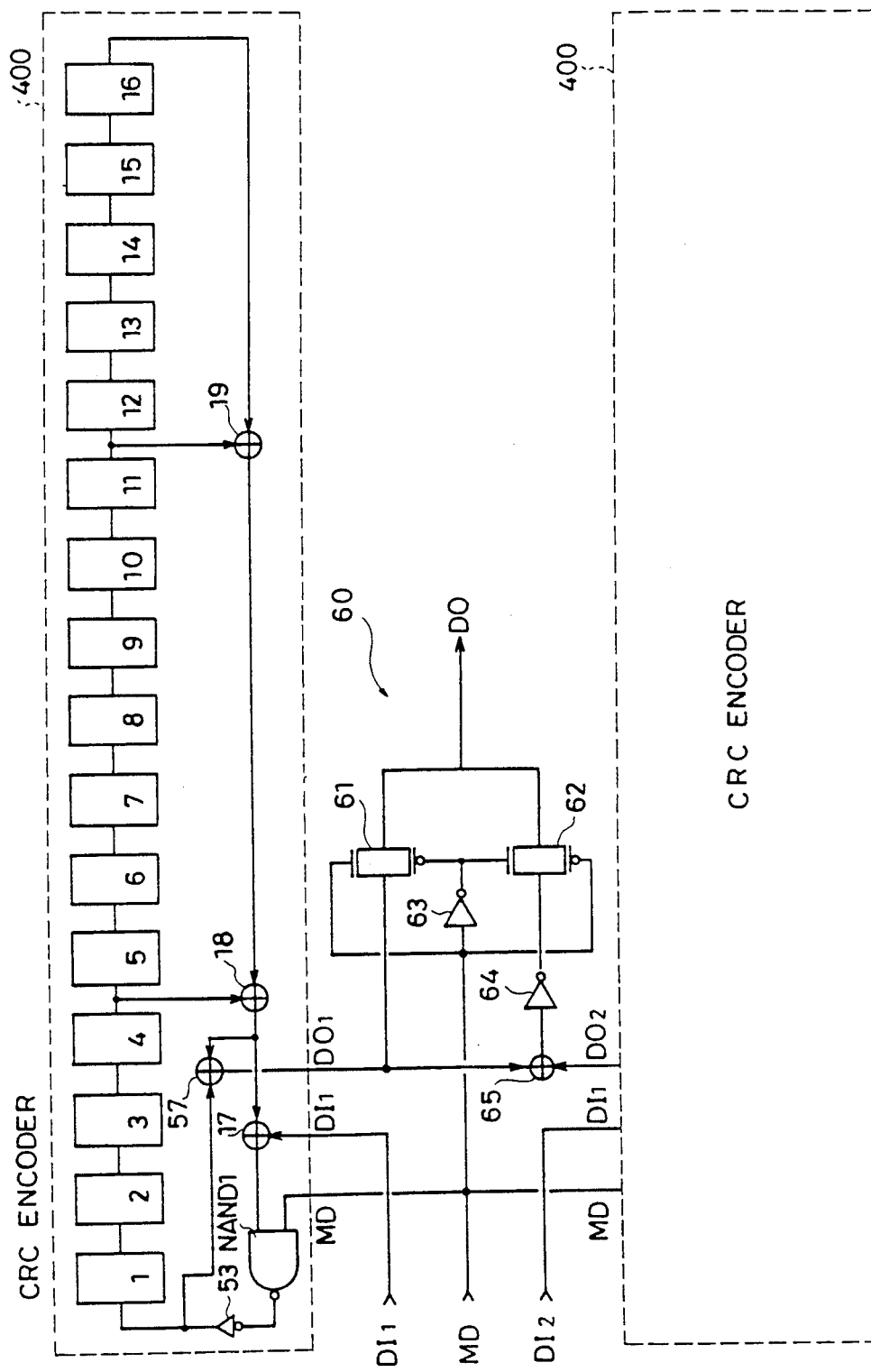
FIG. 10 is a circuit diagram showing another example of FCS encoder.

FIG. 10 is a circuit diagram of an FCS encoder according to another embodiment of the present invention. This FCS encoder can be applied to the FCS encoder 200 shown in FIG. 2. Referring to FIG. 10, the FCS encoder comprises two CRC encoders 400 which have the same circuit structure as the CRC encoder in FIG. 4A. Additionally, this FCS encoder comprises an operation circuit portion 60 which operates according to the above described expression (9). The operation circuit portion 60 comprises transmission gates 61 and 62, inverters 63 and 64, and an EXOR gate 65. The operation given by the expression (9) is performed in the FCS encoder shown in FIG. 10 so that data having a FCS code added thereto is outputted as output data DO.

While in the foregoing, an FCS encoder and an FCS decoder have been described in which the input data DI are serially entered and the output data DO are serially outputted, the present invention is also applicable to an FCS encoder and an FCS decoder which comprise parallel input and parallel output.

Figure 11:
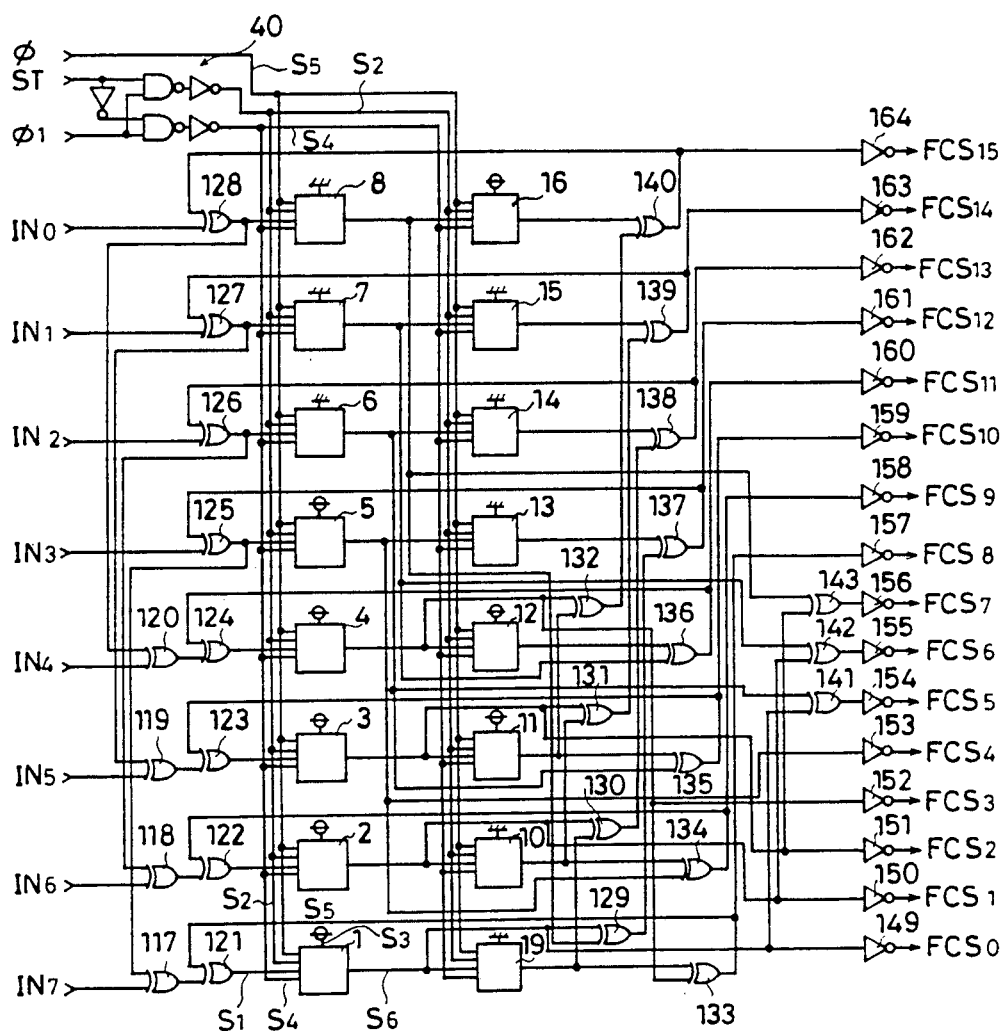
FIG. 11 is a circuit diagram showing a FCS encoder comprising a parallel input/output.

FIG. 11 is a circuit diagram showing an FCS encoder comprising parallel input/output. Referring to FIG. 11, the FCS encoder comprises shift registers 1 through 16, EXOR gates 117 through 143, a gate circuit 40, and inverters 149 and 164. This FCS encoder is also constituted based on the generating polynomial G (X) which is defined by the expression (10).

Figure 12:
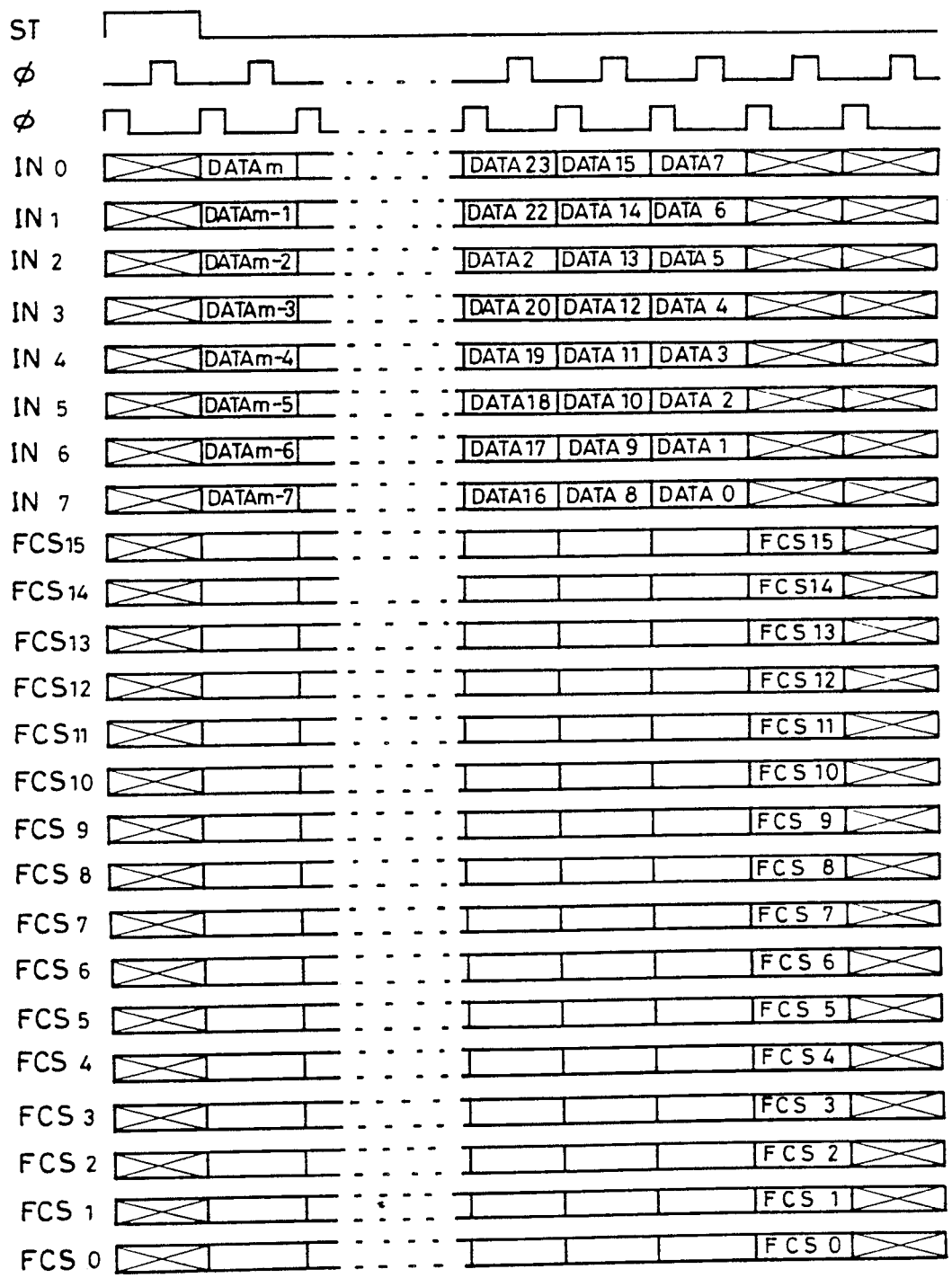
FIG. 12 is a timing chart for explaining operation of the FCS encoder shown in FIG. 11.
Figure 13:
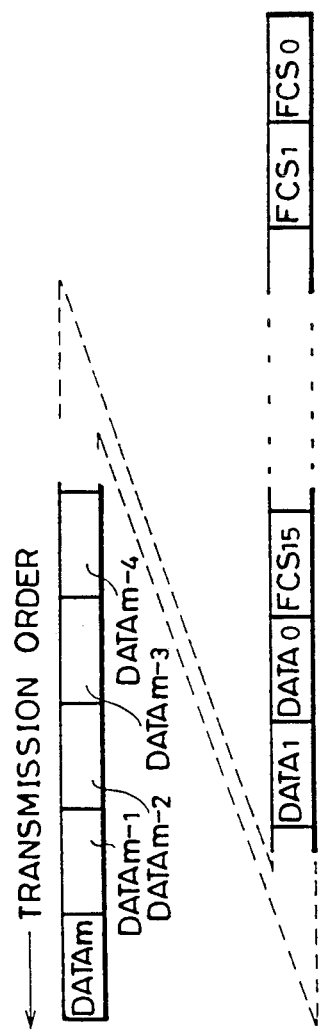
FIG. 13 is a schematic diagram showing a data stream outputted from the FCS encoder shown in FIG. 11.

FIG. 12 is a timing chart for explaining operation of the FCS encoder shown in FIG. 11. FIG. 13 is a schematic diagram showing a data stream outputted from the FCS encoder shown in FIG. 11. Referring to FIGS. 11 to 13, the operation of the FCS encoder will be described below.

In the FCS encoder, data including m+1 bits (m+1=n octet; n is positive integer) are entered by 8 bits in parallel, and 16 bits of an FCS code FCS0 through FCS15 are outputted in parallel. Furthermore, two-phase non-overlap clock signals $\phi 1$ and $\phi 2$ are applied to the encoder on a constant basis. Initially, a high level set signal ST is applied to set the initial value given by the previously described expression (13) in the respective shift registers 1 through 16 which are responsive to the signal ST. Thereafter, the set signal ST falls so that data bits DATAm through DATAn −7 are entered in parallel through input terminals IN0 through IN7. Sequentially, data bits are entered by eight in parallel repeatedly. After the last data bits DATA7 through DATA0 have been entered, any data bits are applied to the input terminals IN0 through IN7 in the following clock cycle. During this clock cycle, 16 bits of an FCS code FCS0 through FCS15 are outputted in parallel. FCS0 through FCS15 of the FCS code obtained through this FCS encoder are transmitted in the transmission order shown in FIG. 13.

Figure 14:
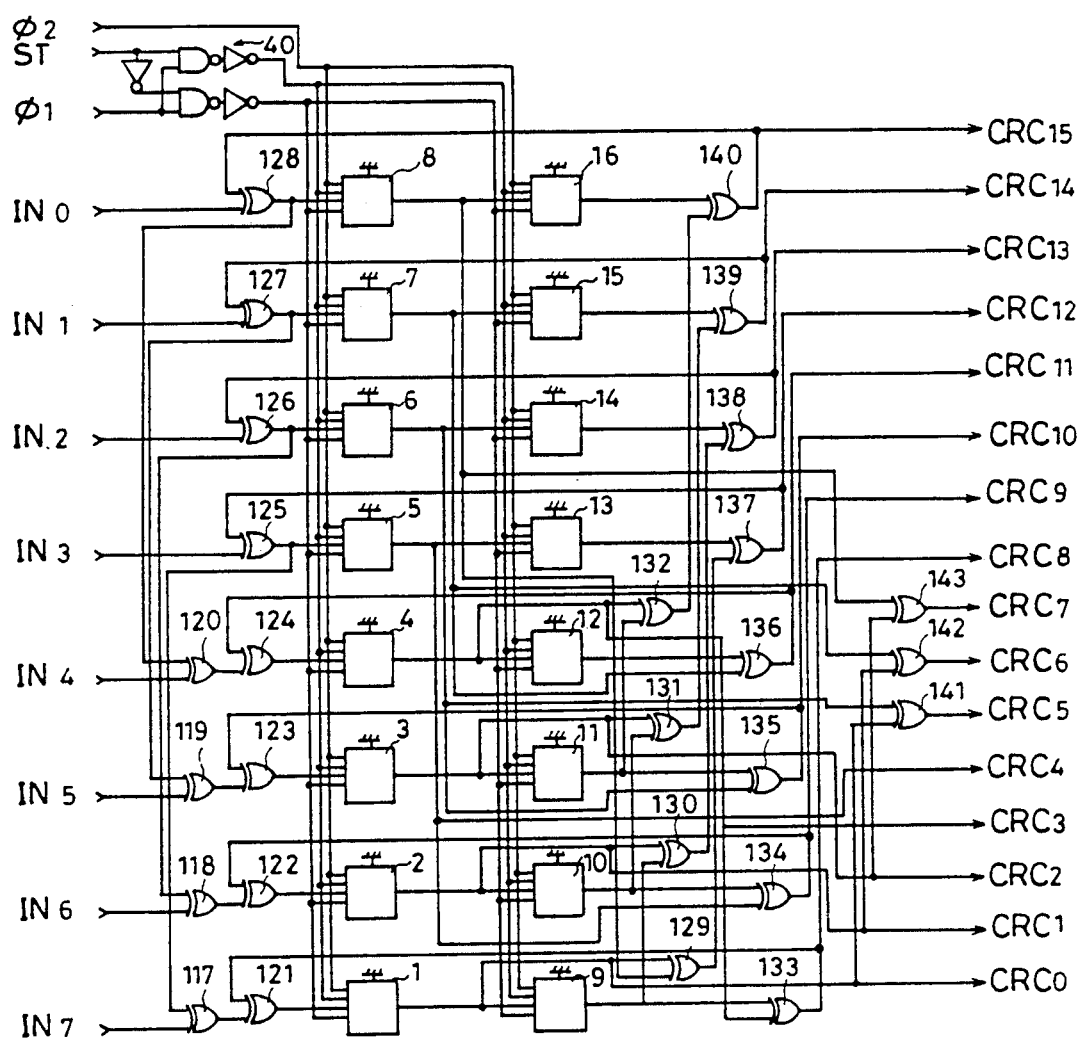
FIG. 14 is a circuit diagram showing a CRC encoder comprising a parallel input/output.

FIG. 14 is a circuit diagram showing a CRC encoder comprising parallel input/output. Referring to FIG. 14, in this CRC encoder, the inverters 149 and 164 shown in FIG. 11 as parts of the FCS encoder are not provided.

Figure 16:
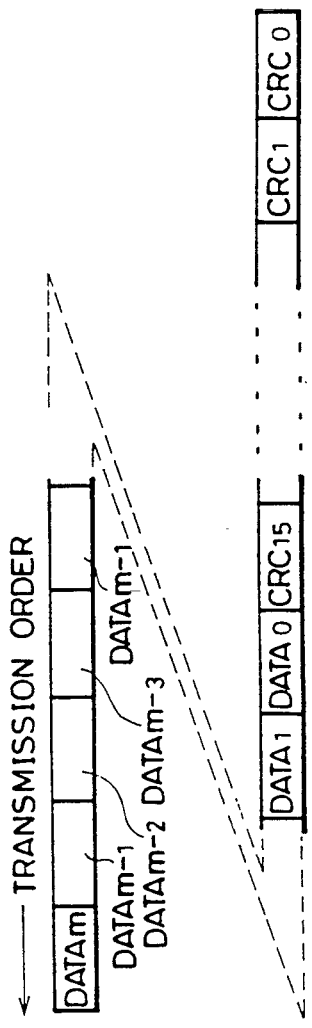
FIG. 16 is a schematic diagram showing a data stream outputted from the CRC encoder shown in FIG. 14.
Figure 15:
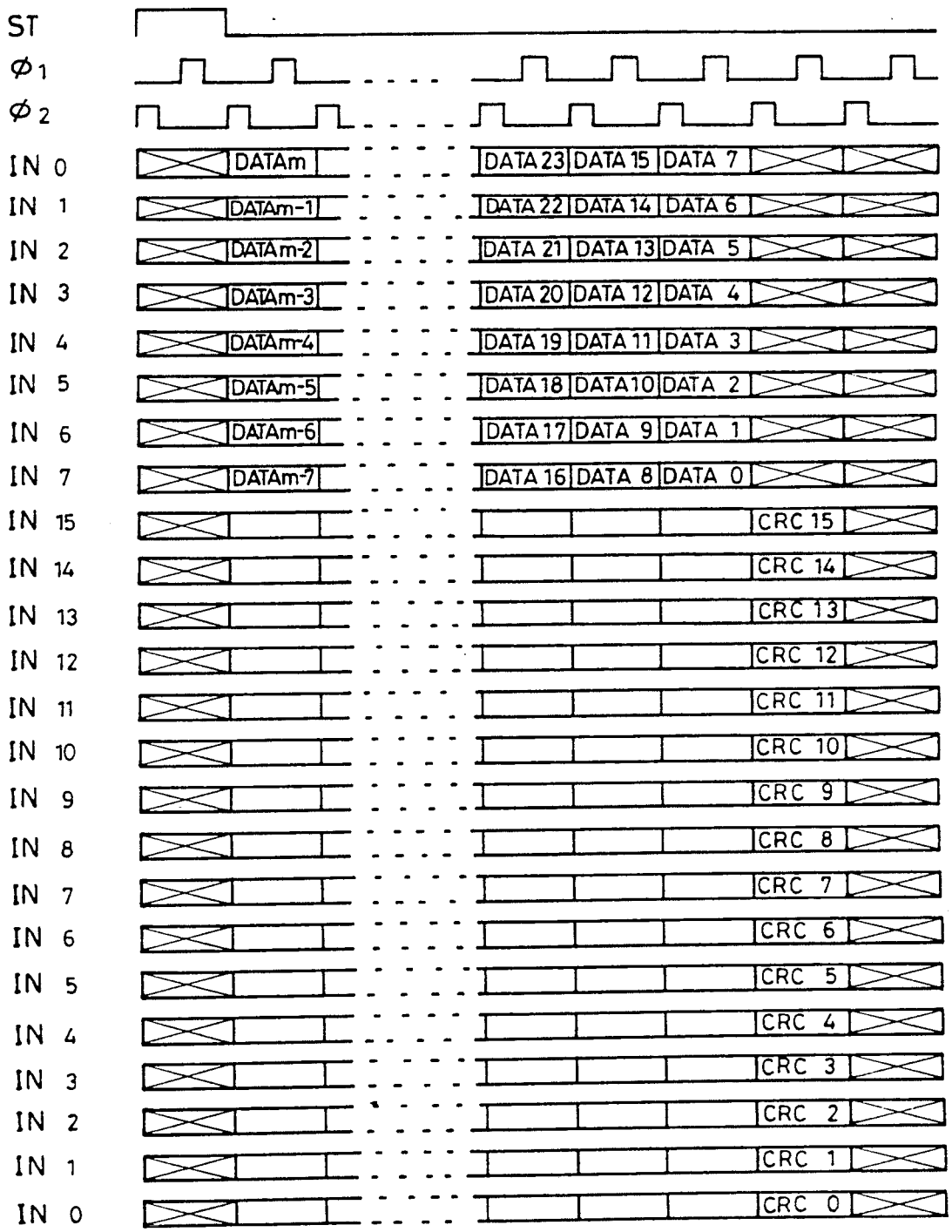
FIG. 15 is a timing chart for explaining operation of the CRC encoder shown in FIG. 14.
Figures 17A, 17B, 17C:
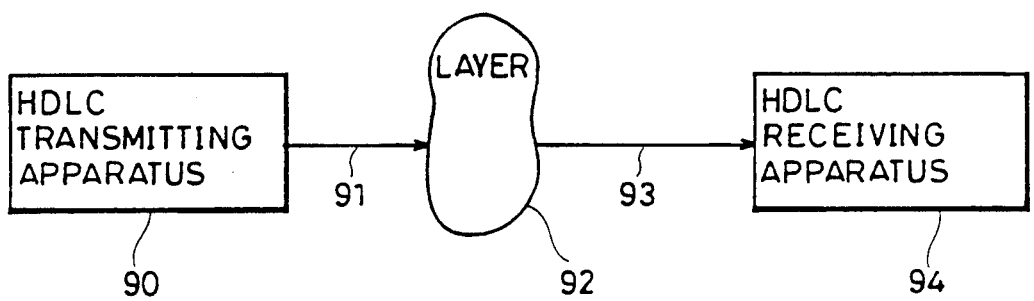
FIG. 17A is an operation diagram according to which division is performed to obtain a CRC code.
FIG. 17B is a conceptional illustration for explaining transmission and reception of an HDLC signal.
FIG. 17C is a format representation for explaining the frame format of the HDLC signal.
Figure 18A:
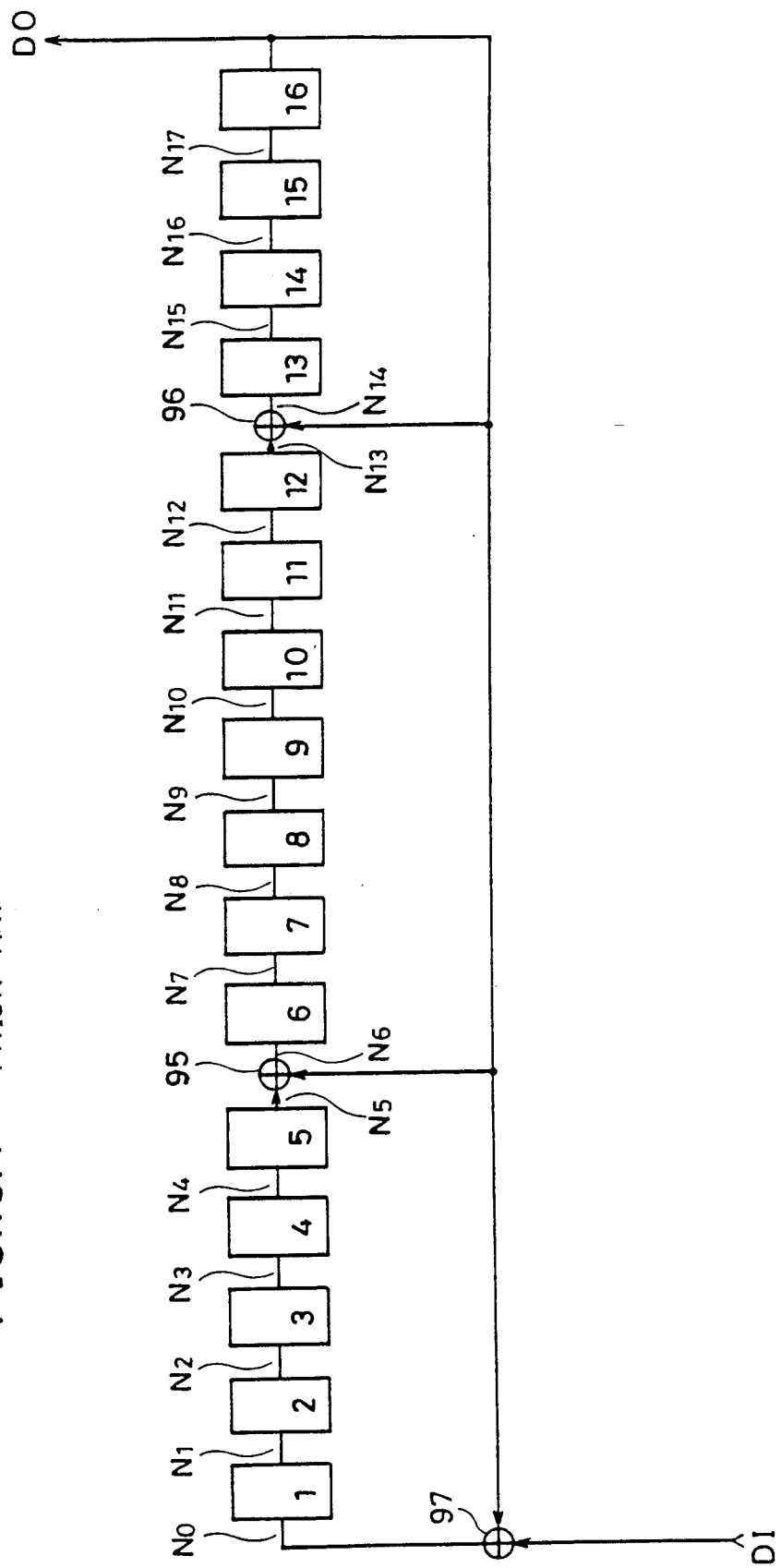
FIG. 18A is a circuit diagram showing an example of the conventional division circuits.

FIG. 15 is a timing chart for explaining operation of the CRC encoder shown in FIG. 14. FIG. 16 is a schematic diagram showing a data stream outputted from the CRC encoder. Referring to FIGS. 14 through 16, the operation of the encoder will be described below.

Two-phase non-overlap clock signals $\phi 1$ and $\phi 2$ are applied to the encoder on a constant basis. Initially, a high level set signal ST is applied to enter "0" in the respective shift registers 1 through 16 which are responsive to the signal ST. Sequentially, after the set signal ST has fallen, the same operation as in the FCS encoder is performed. As a result, in the clock cycle immediately after the last data bits DATA7 through DATA0 have been entered, CRC0 through CRC15 of a CRC code are outputted in parallel. CRC0 through CRC15 of the outputted CRC code are transmitted in the transmission order shown in FIG. 16, or added to the preceding data bits DATAm through DATA0.

As described in the foregoing, a transmitting apparatus and a receiving apparatus which both meet requirements of the transmission error detecting system recommended by the CCITT can be obtained with the use of the FCS encoder shown in FIG. 1A and the FCS decoder shown in FIG. 1C. In the FCS encoder shown in FIG. 1A and the FCS decoder shown in FIG. 1C, there is no need for logical elements such as XOR gates to be connected between the shift registers cascade-connected over 16 stages, which results in regular layout of these circuits constituted on semiconductor chips. Also in the CRC encoder shown in FIG. 4A and the CRC decoder shown in FIG. 6A, the same effect can be obtained. While these encoders and decoders for FCS and CRC have been constituted based on a specific generating polynomial, the present invention can be also applied to another decoder required for another generating polynomial if the initial value of the shift registers 1 through m and the connection points for the EXOR gates are suitably controlled, as has been described with respect to FIG. 9B.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An error check code generating device responsive to data to be transmitted for generating an error check code to check a transmission error, based on a given generating polynomial, comprising:
   first to n-th shift register means in predetermined n stages (n is an integer);
   initial value setting means for setting a given initial value in each of said first to n-th shift register means in the predetermined n stages;

first coincidence detection means for detecting coincidence between an output signal of the n-th shift register means and an output signal of a predetermined i-th shift register means (i< n, i is an integer);

second coincidence detection means for detecting coincidence between an output signal of said first coincidence detection means and an output signal of a predetermined j-th shift register means (j<i, j is an integer);

third coincidence detection means for detecting coincidence between an output signal of said second coincidence detection means and said data to be transmitted, the first shift register means being connected to receive an output signal from said third coincidence detection means; and fourth coincidence detection means for detecting coincidence between an input signal of said first shift register means and an output signal of said second coincidence detection means.

2. The error check code generating device according to claim 1, wherein said first to n-th shift register means in the predetermined n stages and said first to fourth coincidence detection means constitute operation means responsive to input data bits for outputting error check bits.

3. The error check code generating device according to claim 2, wherein said operation means further comprises multiplication circuit means and division circuit means.

4. The error check code generating device according to claim 3, wherein said error check bits comprise cyclic redundancy check (CRC) bits.

5. The error check code generating device according to claim 3, wherein said error check bits comprise frame check sequence (FCS) bits, said n includes 16,
said i includes 11, and
said j includes 4.

6. The error check code generating device according to claim 3, further comprising:

switching means connected between an output of said third coincidence detection means and an input of the first shift register means and responsive to a mode signal for selecting an operation mode of said operating means.

7. The error check code generating device according to claim 1, wherein each of said first to fourth coincidence detection means comprises an exclusive OR (EXOR) gate.

8. A transmission error detecting device responsive to a transmission signal transmitted from a transmitting apparatus for detecting a transmission error which may have occurred in the transmission system, wherein said transmission signal comprises data to be transmitted, and an error check code obtained through an operation based on a given generating polynomial, comprising:

receiving means for receiving the transmission signal from said transmitting apparatus;

first to n-th shift register means in predetermined n stages (n is an integer);

initial value setting means for setting a given initial value in each of said first to n-th shift registers in the predetermined n stages;

first coincidence detection means for detecting coincidence between an output signal of the n-th shift register means and an output signal of a predetermined i-th shift register means (i<n, i is an integer);

second coincidence detection means for detecting coincidence between an output signal of said first coincidence detection means and an output signal of a predetermined j-th shift register means (j<i, j is an integer);

third coincidence detection means for detecting coincidence between an output signal of said second coincidence detection means and a received signal received by said receiving means, the first shift register means being connected to receive an output signal from said third coincidence detection means; and fourth coincidence detection means for detecting coincidence among input signals entered in each of said shift register means in the n stages.

9. The transmission error detecting device according to claim 8, wherein said first to n-th shift register means in the predetermined n stages and said first to fourth coincidence detection means constitute operation means responsive to input data bits for outputting error check bits.

10. The transmission error detecting device according to claim 9, wherein said operation means further comprises multiplication circuit means and division circuit means.

11. The transmission error detecting device according to claim 10, wherein said error check bits comprise cyclic redundancy check (CRC) bits.

12. The transmission error detecting device according to claim 10, wherein said error check bits comprise frame check sequence (FCS) bits, said n includes 16,
said i includes 11, and
said j includes 4.

13. The transmission error detecting device according to claim 8, wherein each of said first to fourth coincidence detection means comprises an exclusive OR (EXOR) gate.

* * * * *

UNITED STATES PATENT AND TRADEMARK OFFICE
CERTIFICATE OF CORRECTION

PATENT NO. : 5,062,111
DATED : October 29, 1991
INVENTOR(S) : Kouji GOTOU et al.

It is certified that error appears in the above-identified patent and that said Letters Patent is hereby corrected as shown below:

Column 12, line 59, change "$(X) \cdot X^{16} = Q(X) \cdot G(X) + CRC(X)...$"
to --$D(X) \cdot X^{16} = Q(X) \cdot G(X) + CRC(X)...$--.

Signed and Sealed this

Seventh Day of December, 1993

Attest:

BRUCE LEHMAN

Attesting Officer

Commissioner of Patents and Trademarks